(12) United States Patent
Min et al.

(10) Patent No.: US 11,244,909 B2
(45) Date of Patent: Feb. 8, 2022

(54) PACKAGE STRUCTURE AND METHOD FOR MANUFACTURING THE SAME

(71) Applicant: Advanced Semiconductor Engineering, Inc., Kaohsiung (TW)

(72) Inventors: Fan-Yu Min, Kaohsiung (TW); Chen-Hung Lee, Kaohsiung (TW); Wei-Hang Tai, Kaohsiung (TW); Yuan-Tzuo Luo, Kaohsiung (TW); Wen-Yuan Chuang, Kaohsiung (TW); Chun-Cheng Kuo, Kaohsiung (TW); Chin-Li Kao, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/817,407

(22) Filed: Mar. 12, 2020

(65) Prior Publication Data

US 2021/0287999 A1   Sep. 16, 2021

(51) Int. Cl.

| H01L 23/00 | (2006.01) |
|---|---|
| H01L 23/16 | (2006.01) |
| H01L 23/31 | (2006.01) |
| H01L 23/538 | (2006.01) |
| H01L 21/48 | (2006.01) |
| H01L 21/56 | (2006.01) |

(52) U.S. Cl.
CPC ........ *H01L 23/562* (2013.01); *H01L 21/4853* (2013.01); *H01L 21/4857* (2013.01); *H01L 21/563* (2013.01); *H01L 21/568* (2013.01); *H01L 23/16* (2013.01); *H01L 23/3185* (2013.01); *H01L 23/5383* (2013.01); *H01L 23/5386* (2013.01); *H01L 24/16* (2013.01); *H01L 2224/16227* (2013.01); *H01L 2924/18161* (2013.01); *H01L 2924/3511* (2013.01); *H01L 2924/35121* (2013.01)

(58) Field of Classification Search
CPC ... H01L 23/562; H01L 23/3185; H01L 23/16; H01L 21/4857; H01L 21/568; H01L 23/5386; H01L 21/4853; H01L 24/16; H01L 21/563; H01L 23/5383; H01L 2924/35121; H01L 2224/16227; H01L 2924/3511; H01L 2924/18161
See application file for complete search history.

(56) References Cited

U.S. PATENT DOCUMENTS

| 2004/0061183 | A1* | 4/2004 | Johnson | H01L 21/765 |
| | | | | 257/373 |
| 2006/0103003 | A1* | 5/2006 | Heide | H01L 23/315 |
| | | | | 257/700 |
| 2010/0039537 | A1* | 2/2010 | Oten | H04N 5/374 |
| | | | | 348/241 |

(Continued)

*Primary Examiner* — Nicholas J Tobergte
(74) *Attorney, Agent, or Firm* — Foley & Lardner LLP

(57) ABSTRACT

A package structure and a manufacturing method are provided. The package structure includes a wiring structure, a first electronic device and a second electronic device. The first electronic device is disposed on the wiring structure. The second electronic device is disposed on the wiring structure. The first electronic device and the second electronic device are disposed side by side. A gap between the first electronic device and the second electronic device is greater than or equal to about 150 μm.

15 Claims, 20 Drawing Sheets

(56) References Cited

U.S. PATENT DOCUMENTS

| | | | |
|---|---|---|---|
| 2013/0082380 A1* | 4/2013 | Crisp | H01L 24/17 |
| | | | 257/737 |
| 2014/0319681 A1* | 10/2014 | Maohua | H01L 25/105 |
| | | | 257/738 |
| 2021/0118812 A1* | 4/2021 | Liu | H01L 23/5386 |
| 2021/0151407 A1* | 5/2021 | Liu | H01L 23/3128 |
| 2021/0159188 A1* | 5/2021 | Fang | H01L 21/56 |

\* cited by examiner

PACKAGE STRUCTURE AND METHOD FOR MANUFACTURING THE SAME

BACKGROUND

1. Field of the Disclosure

The present disclosure relates to a package structure and a manufacturing method, and to a package structure including a protection material, and a method for manufacturing the same.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may occur during the thermal process. Since a rigidity or stiffness of the semiconductor package structure is relatively low, a crack may be formed at the top surface of the semiconductor package structure or in the protection material, and then extend or grow into the interior of the semiconductor package structure. If the crack reaches the semiconductor package structure, the circuit layer in the semiconductor package structure may be damaged or broken, which may result in an open circuit and render the semiconductor package structure inoperative. Thus, a yield of the semiconductor package structure may decrease.

SUMMARY

In some embodiments, a package structure includes a wiring structure, a first electronic device and a second electronic device. The first electronic device is disposed on the wiring structure. The second electronic device is disposed on the wiring structure. The first electronic device and the second electronic device are disposed side by side. A gap between the first electronic device and the second electronic device is greater than or equal to about 150 µm.

In some embodiments, a package structure includes a wiring structure, a first electronic device, a second electronic device and a protection material. The first electronic device is disposed on the wiring structure, and has a first active area. The second electronic device is disposed on the wiring structure. The first electronic device and the second electronic device are disposed side by side. The first electronic device further has a first lateral side surface facing to the second electronic device and a second lateral side surface opposite to the first lateral side surface. A first distance between the first lateral side surface and the first active area is less than a second distance between the second lateral side surface and the first active area. The protection material substantially fills a gap between the first electronic device and the second electronic device.

In some embodiments, a manufacturing method includes: (a) providing a wiring structure; (b) disposing a first electronic device and a second electronic device on the wiring structure side by side; (c) applying a protection material along a lateral side surface of the first electronic device; and (d) applying the protection material along another lateral side surface of the first electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
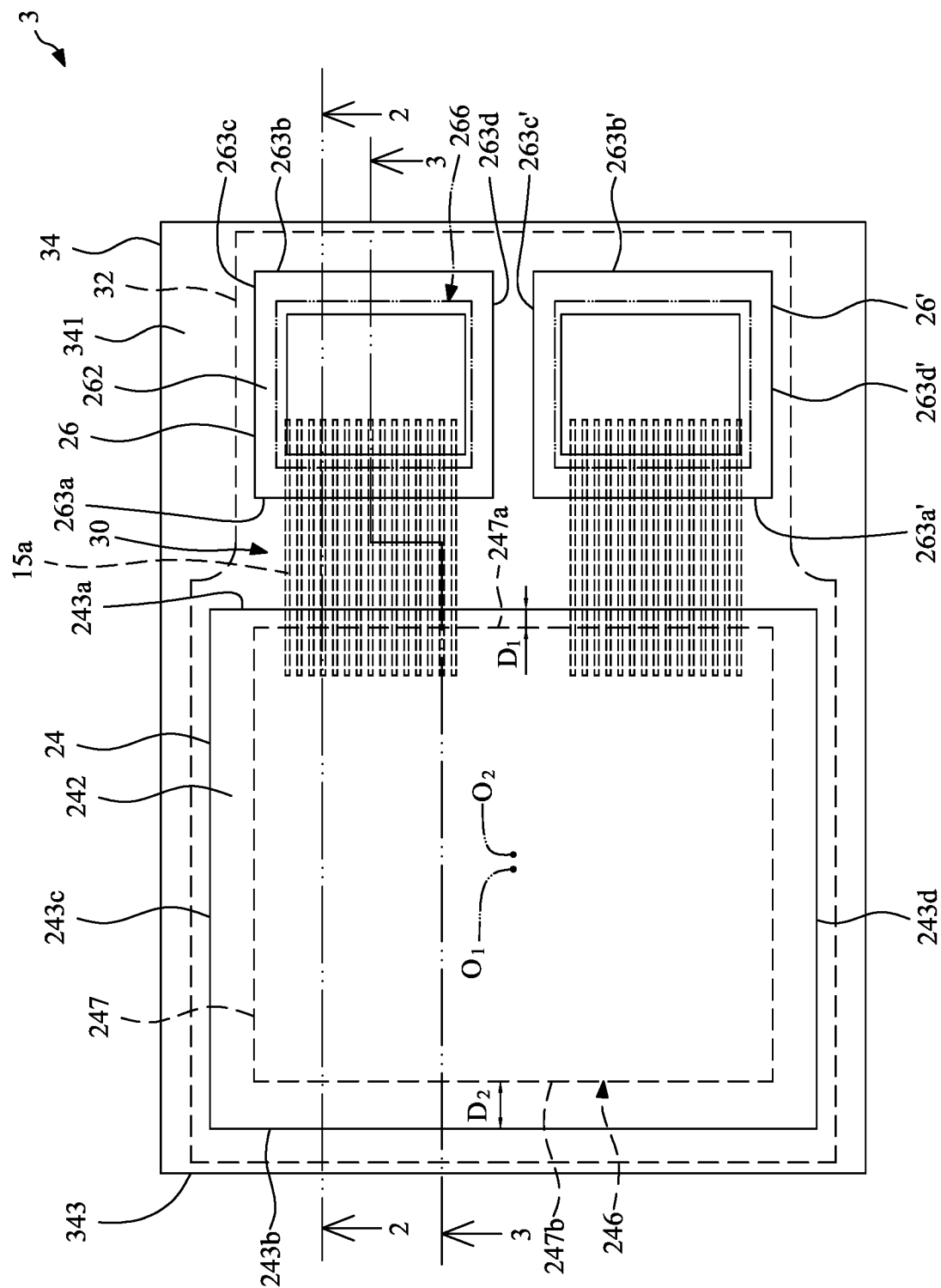
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance so as to improve a reliability or a yield thereof. At least some embodiments of the present disclosure further provide for techniques for manufacturing the package structure and an assembly structure.

Figure 2:
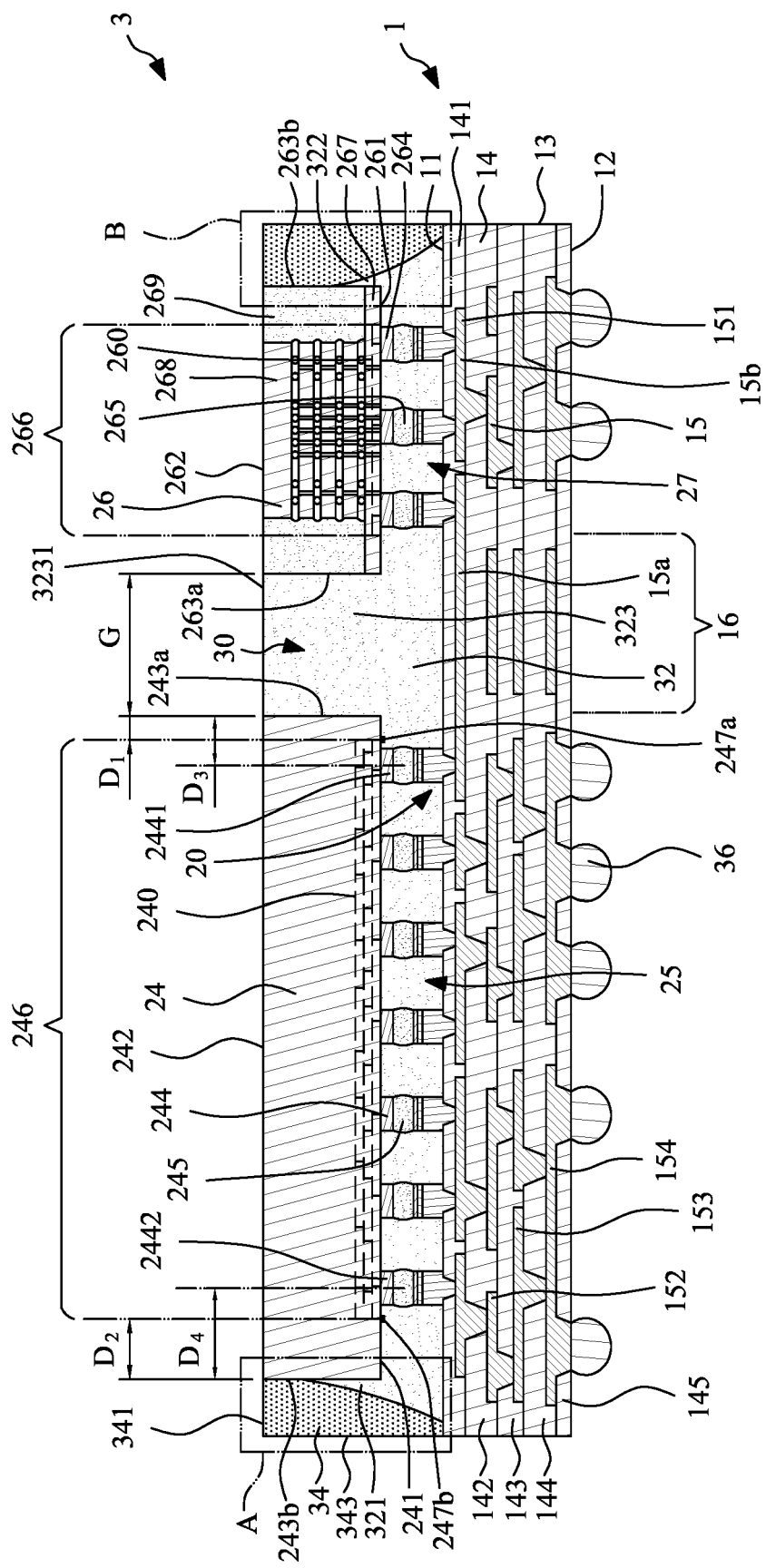
FIG. 2 illustrates a cross-sectional view taken along line 2-2 of the package structure 3 of FIG. 1.
Figure 3:
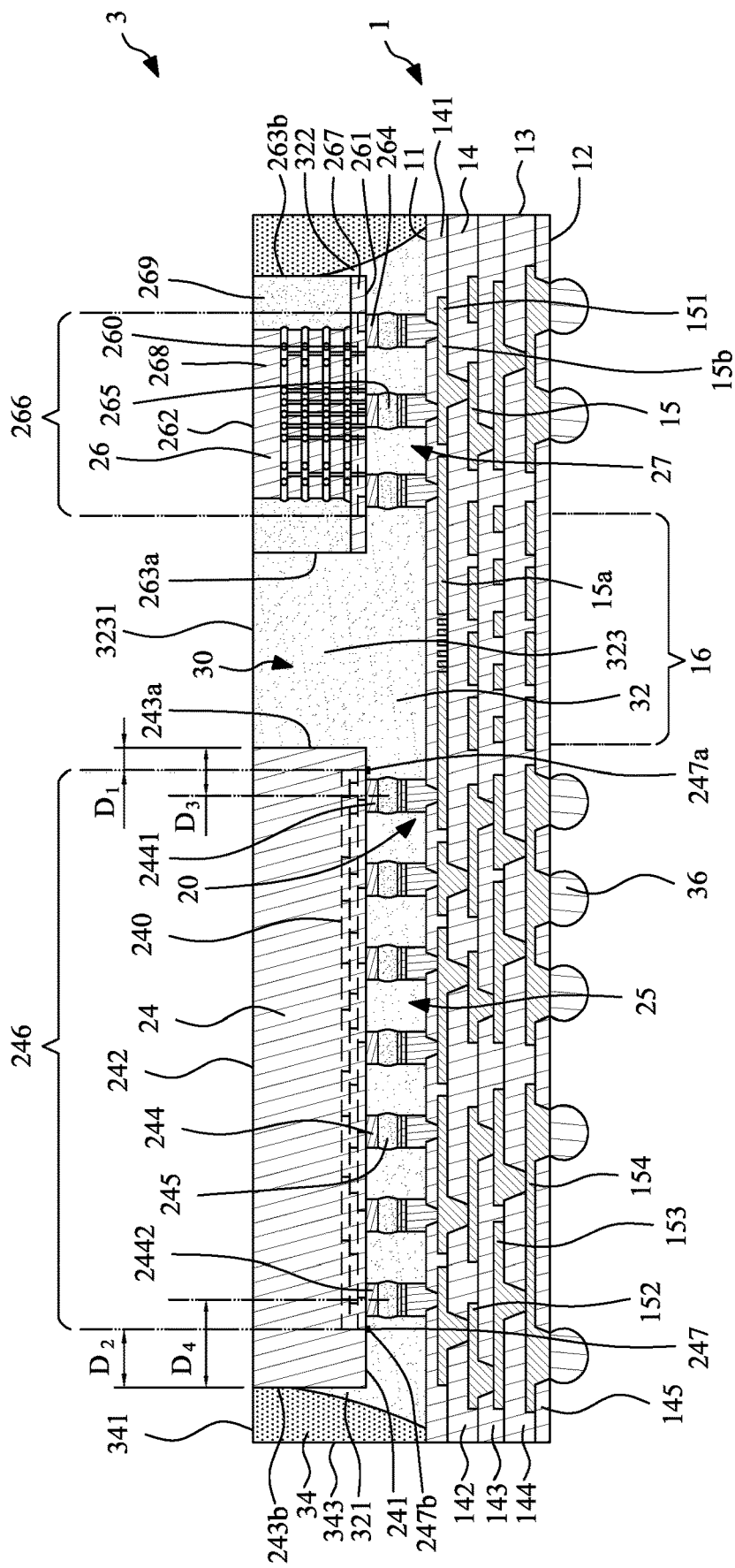
FIG. 3 illustrates a cross-sectional view taken along line 3-3 of the package structure 3 of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. The package structure 3 includes a wiring structure 1, a plurality of protrusion pads 20, a first electronic device 24, two second electronic devices 26, 26', a first protection material 32, a second protection material 34 and a plurality of solder materials 36. As shown in FIG. 1, the package structure 3 may include one first electronic device 24 and two second electronic devices 26, 26'. However, the amounts of the first electronic device(s) 24 and the second electronic device(s) 26, 26' are not limited in the present disclosure.

As shown in FIG. 2 and FIG. 3, the wiring structure 1 has a first surface 11, a second surface 12 opposite to the first surface 11, a lateral side surface 13 extending between the first surface 11 and the second surface 12, and a high line density region 16 (or a fine line region) between the first electronic device 24 and the second electronic devices 26, 26'. The wiring structure 1 may include at least one dielectric layer 14, at least one circuit layer 15 in contact with the dielectric layer 14, and a plurality of protrusion pads 20. For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high line density region 16, and the periphery portion 15b is located outside the high line density region 16 (e.g., a low line density region). For example, the second electronic devices 26, 26' may be electrically connected to the first electronic device 24 through the interconnection portion 15a of the first circuit layer 151. The second electronic devices 26, 26' and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 μm/about 5 μm, or less than or equal to about 2 μm/about 2 μm, or less than or equal to about 0.8 μm/about 0.8 μm. An L/S of the traces of the periphery portion 15b may be less than or equal to about 10 μm/about 10 μm, or less than or equal to about 7 μm/about 7 μm, or less than or equal to about 5 μm/about 5 μm.

The first dielectric layer 141 and the first circuit layer 151 may be disposed on the second dielectric layer 142. In addition, the second dielectric layer 142 may cover the second circuit layer 152. A portion (i.e., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high line density region 16, and a periphery portion located outside the high line density region 16. In some embodiments, the via portion of the first circuit layer 151 may extend from the periphery portion, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (i.e., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high line density region 16, and a periphery portion located outside the high line density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (i.e., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high line density region 16, and a periphery portion located outside the high line density region 16.

The fourth dielectric layer 144 and the fourth circuit layer 154 may be disposed on the fifth dielectric layer 145. A portion (i.e., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic devices 26, 26' may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic devices 26, 26' and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (i.e., the topmost dielectric layer or the outermost dielectric layer) of the wiring structure 1. The protrusion pads 20 may be disposed on and protrude from the first surface 11 of the wiring structure 1, and extend through the first dielectric layer 141 (i.e., the topmost dielectric layer or the outermost dielectric layer) to electrically connect the first circuit layer 151.

The first electronic device 24 and the second electronic devices 26, 26' are disposed adjacent to or disposed on the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 1 to FIG. 3, the first electronic device 24 has a first active surface 241 (e.g., bottom surface), a first backside surface 242 (e.g., top surface), a first lateral side surface 243a, a second lateral side surface 243b, a third lateral side surface 243c and a fourth lateral side surface 243d. The first backside surface 242 is opposite to the first active surface 241. All of the first lateral side surface 243a, the second lateral side surface 243b, the third lateral side surface 243c and the fourth lateral side surface 243d extend between the first active surface 241 and the first backside surface 242. The first lateral side surface 243a faces to the second electronic device 26. The second lateral side surface 243b is opposite to the first lateral side surface 243a. The fourth lateral side surface 243d is opposite to the third lateral side surface 243c.

Further, the first electronic device 24 may include a main body, a first active area 246, a plurality of electrical contacts 244 and a seal ring 247. The main body may include a silicon material. The first active area 246 may be disposed on the main body and may be disposed adjacent to the first active surface 241. There may be a plurality of active circuit layers 240 and a plurality of electrical elements electrically connected with each other and disposed within the first active area 246. There may be no active circuit layers and electrical elements disposed outside the first active area 246. In some embodiments, the seal ring 247 may be disposed on the main body and may be disposed adjacent to the first active surface 241. For example, the seal ring 247 may define the first active area 246. That is, the first active area 246 may be the area that is surrounded by the seal ring 247. The seal ring 247 may have a first edge 247a and a second edge 247b opposite to the first edge 247a.

The electrical contacts 244 may be disposed adjacent to the first active surface 241 and within the first active area 246. The electrical contacts 244 may be electrically connected to the active circuit layers 240 in the first active area 246. The electrical contacts 244 may be exposed or may protrude from the first active surface 241 for electrical connection. The electrical contacts 244 may be pads, bumps, studs, pillars or posts. In some embodiments, the electrical contacts 244 of the first electronic device 24 may be electrically connected and physically connected to the protrusion pads 21 through a plurality of solder materials 245. In other words, the first electronic device 24 may be electrically connected to the wiring structure 1 by flip-chip bonding.

As shown in FIG. 1, the first electronic device 24 has a first center $O_1$ from a top view. The first active area 246 has a second center $O_2$ from a top view. The second center $O_2$ of the first active area 246 is located between the first center $O_1$ of the first electronic device 24 and the second electronic device 26. That is, the second center $O_2$ of the first active area 246 is misaligned with the first center $O_1$ of the first electronic device 24. The first active area 246 and the first electronic device 24 are not concentric from a top view. In addition, a first distance $D_1$ between the first lateral side surface 243a and the first active area 246 is less than a second distance $D_2$ between the second lateral side surface 243b and the first active area 246. It is noted that the first distance $D_1$ may be a distance between the first lateral side surface 243a and the first edge 247a of the seal ring 247, and the second distance $D_2$ may be a distance between the second lateral side surface 243b and the second edge 247b of the seal ring 247. As shown in FIG. 2 and FIG. 3, the electrical contacts 244 may include at least one first outermost electrical contact 2441 and at least one second outermost electrical contact 2442. The first outermost electrical contact 2441 is the outermost electrical contact that is nearest to the second electronic devices 26. The second outermost electrical contact 2442 is the outermost electrical contact that is farthest to the second electronic devices 26. The second outermost electrical contact 2442 is opposite to the first outermost electrical contact 2441. In addition, a third distance $D_3$ between the first lateral side surface 243a and the first outermost electrical contact 2441 is less than a fourth distance $D_4$ between the second lateral side surface 243b and the second outermost electrical contact 2442.

The second electronic device 26 may be a semiconductor device such as high bandwidth memory (HBM) die. The second electronic device 26 has a second active surface 261 (e.g., bottom surface), a second backside surface 262 (e.g., top surface), a second active area 266, a first lateral side surface 263a, a second lateral side surface 263b, a third lateral side surface 263c and a fourth lateral side surface 263d. The first lateral side surface 263a faces to the first electronic device 24 or a gap 30 between the first lateral side surface 243a of the first electronic device 24 and the first lateral side surface 263a of the second electronic device 26. The second backside surface 262 is opposite to the second active surface 261. The second active area 266 is disposed adjacent to the second active surface 261. There may be a plurality of active circuit layers 260 and a plurality of electrical elements electrically connected with each other and disposed within the second active area 266. There may be no active circuit layers and electrical elements disposed outside the second active area 266. All of the first lateral side surface 263a, the second lateral side surface 263b, the third lateral side surface 263c and the fourth lateral side surface 263d extend between the second active surface 261 and the second backside surface 262. The second lateral side surface 263b is opposite to the first lateral side surface 263a. The fourth lateral side surface 263d is opposite to the third lateral side surface 263c.

Further, the second electronic device 26 may include a plurality of electrical contacts 264 disposed adjacent to the second active surface 261 and within the second active area 266. The electrical contacts 264 may be exposed or may protrude from the second active surface 261 for electrical connection. The electrical contacts 264 may be pads, bumps, studs, pillars or posts. In some embodiments, the electrical contacts 264 of the second electronic device 26 may be electrically connected and bonded to the protrusion pads 20 through a plurality of solder materials 265. In other words, the second electronic device 26 may be bonded to the wiring structure 1 by flip-chip bonding. As shown in FIG. 2 and FIG. 3, the second electronic device 26 may include a logic die 267, a plurality of memory dice 268 and a second encapsulant 269. The memory dice 268 may be stacked on the logic die 267. The second encapsulant 269 may cover the logic die 267 and the memory dice 268.

As shown in FIG. 2 and FIG. 3, a gap 30 is formed between the first lateral side surface 243a of the first electronic device 24 and the first lateral side surface 263a of the second electronic device 26. That is, the first lateral side surface 243a of the first electronic device 24 faces the first lateral side surface 263a of the second electronic device 26 to define the gap 30. A width G of the gap 30 may be defined as a minimum distance between the first lateral side surface 243a of the first electronic device 24 and the first lateral side surface 263a of the second electronic device 26. The width G of the gap 30 may be greater than or equal to about 150 μm, greater than or equal to about 200 μm, or greater than or equal to about 300 μm. For example, the width G of the gap 30 may be in a range of 200 μm to 400 μm. As shown in FIG. 1, the second center $O_2$ of the first active area 246 is located between the first center $O_1$ of the first electronic device 24 and the gap 30. The first center $O_1$ is further away from the second electronic device 26 than the second center $O_2$. That is, a distance between the first center $O_1$ and the second electronic device 26 is greater than a distance between the second center $O_2$ and the second electronic device 26.

As shown in FIG. 2 and FIG. 3, the first protection material 32 (i.e., an underfill) may be disposed in a first space 25 between the first electronic device 24 and the wiring structure 1 so as to cover and protect the joints formed by the electrical contacts 244, the protrusion pads 20 and the solder materials 245. Further, the first protection material 32 may be disposed in a second space 26 between the second electronic device 26 and the wiring structure 1 so as to cover and protect the joints formed by the electrical contacts 264, the protrusion pads 20 and the solder materials 265. In addition, the first protection material 32 may include a first portion 321, a second portion 322 and a third portion 323. The third portion 323 of the first protection material 32 may further extend into the gap 30 to substantially fill the gap 30. Alternatively, the third portion 323 of the first protection material 32 may completely fill the gap 30, and may have a top surface 3231 substantially coplanar with the first backside surface 242 of the first electronic device 24 and the second backside surface 262 of the second electronic device 26. In some embodiments, the first portion 321 of the first protection material 32 may extend to or may be disposed on the second lateral side surface 243b of the first electronic device 24, and the second portion 322 of the first protection material 32 may extend to or may be disposed on the second lateral side surface 263b of the second electronic device 26.

The second protection material 34 (e.g., a first encapsulant) may cover at least a portion of the first electronic device 24, at least a portion of the second electronic device 26 and the first protection material 32. The second protection material 34 may cover at least a portion of the second lateral side surface 243b of the first electronic device 24 and at least a portion of the second lateral side surface 263b of the second electronic device 26. The second protection material 34 may not contact the lateral side surface 2671 of the logic die 267. A material of the second protection material 34 may be a molding compound with or without fillers. The second protection material 34 has a first surface 341 (e.g., a top surface) and a lateral side surface 343. As shown in FIG. 2 and FIG. 3, the first surface 341 of the second protection material 34, the first backside surface 242 of the first electronic device 24, the second backside surface 262 of the second electronic device 26 and the top surface 3231 of the third portion 323 of the first protection material 32 may be substantially coplanar with each other. In addition, the lateral side surface 343 of the second protection material 34 may be substantially coplanar with the lateral side surface 13 of the wiring structure 1.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (i.e., the bottom portions of the via portions) of the fourth circuit layer 154.

In the embodiment illustrated in FIG. 1 to FIG. 3, the first protection material 32 fills the large gap 30 between the first electronic device 24 and the second electronic device 26 so that the warpage of the wiring structure 1 and the package structure 3 may be reduced, and the delamination between the first protection material 32 second protection material 34 may be avoided. Further, the first electronic device 24 and the second electronic device 26 are spaced apart by the large gap 30, thus, the risk of formation of crack in the third portion 323 of the first protection material 32 due to the stress concentration between the bottom corners of the first electronic device 24 and the second electronic device 26 is low. Therefore, the reliability and yield of the package structure 3 is improved.

Figure 4:
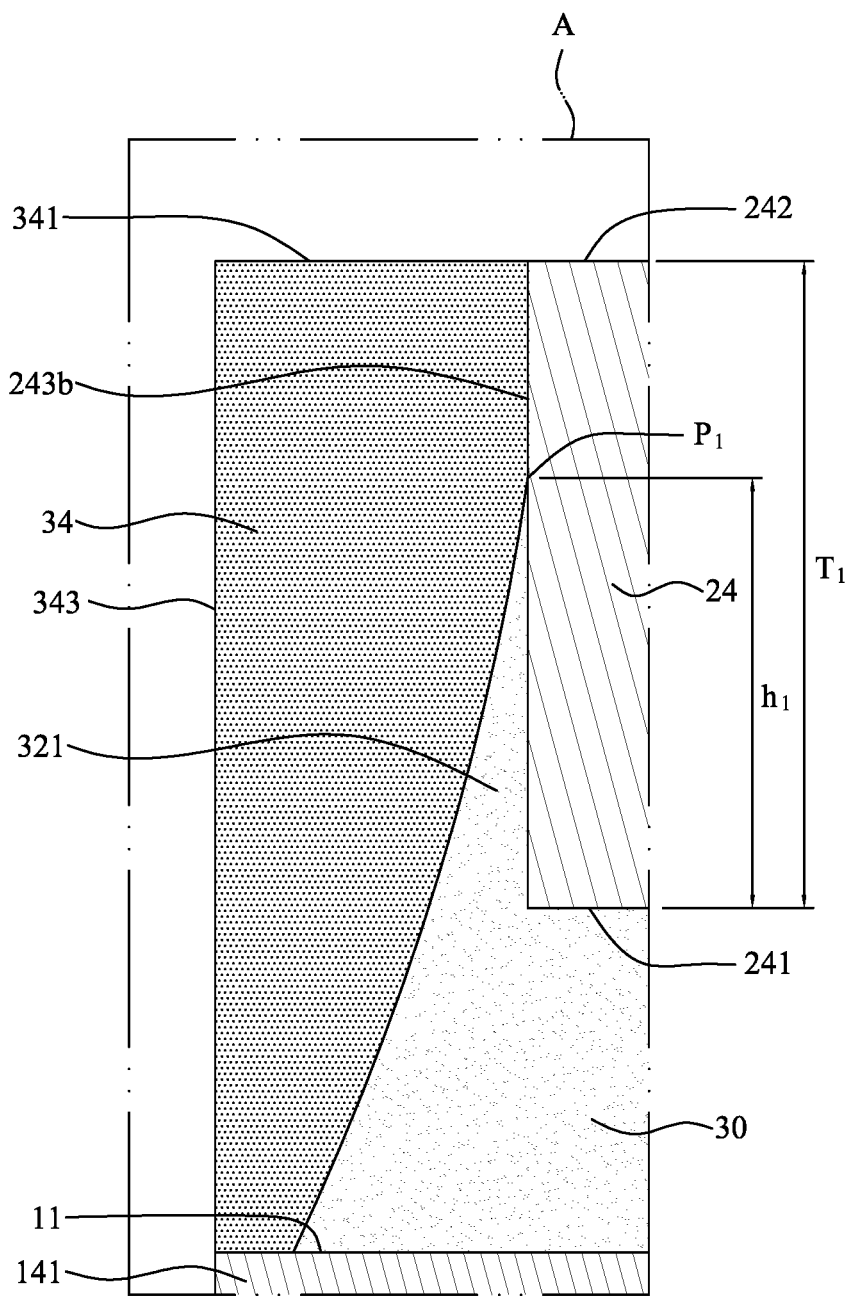
FIG. 4 illustrates an enlarged view of a region "A" in FIG. 2.

FIG. 4 illustrates an enlarged view of a region "A" in FIG. 2. A thickness of the first electronic device 24 is $T_1$. The first portion 321 of the first protection material 32 extends on the second lateral side surface 243b of the first electronic device 24 and covers at least a portion of the second lateral side surface 243b of the first electronic device 24. A highest point of the first portion 321 of the protection material 32 on the second lateral side surface 243b of the first electronic device 24 is $P_1$. A first height (e.g., a maximum height) of the first portion 321 of the protection material 32 on the second lateral side surface 243b of the first electronic device 24 is $h_1$. The first height $h_1$ is measured from the first active surface 241 toward the first backside surface 242, and is the vertical distance between the first active surface 241 and the highest point $P_1$. In some embodiments, the first height $h_1$ is greater than or equal to 0.5 times the thickness $T_1$, greater than or equal to 0.6 times the thickness $T_1$, greater than or equal to 0.7 times the thickness $T_1$, or greater than or equal to 0.8 times the thickness $T_1$. Alternatively, the first portion 321 of the first protection material 32 may cover the entire second lateral side surface 243b of the first electronic device 24. The large first height $h_1$ of the first portion 321 of the first protection material 32 may reduce the delamination between the first protection material 32 second protection material 34.

Figure 5:
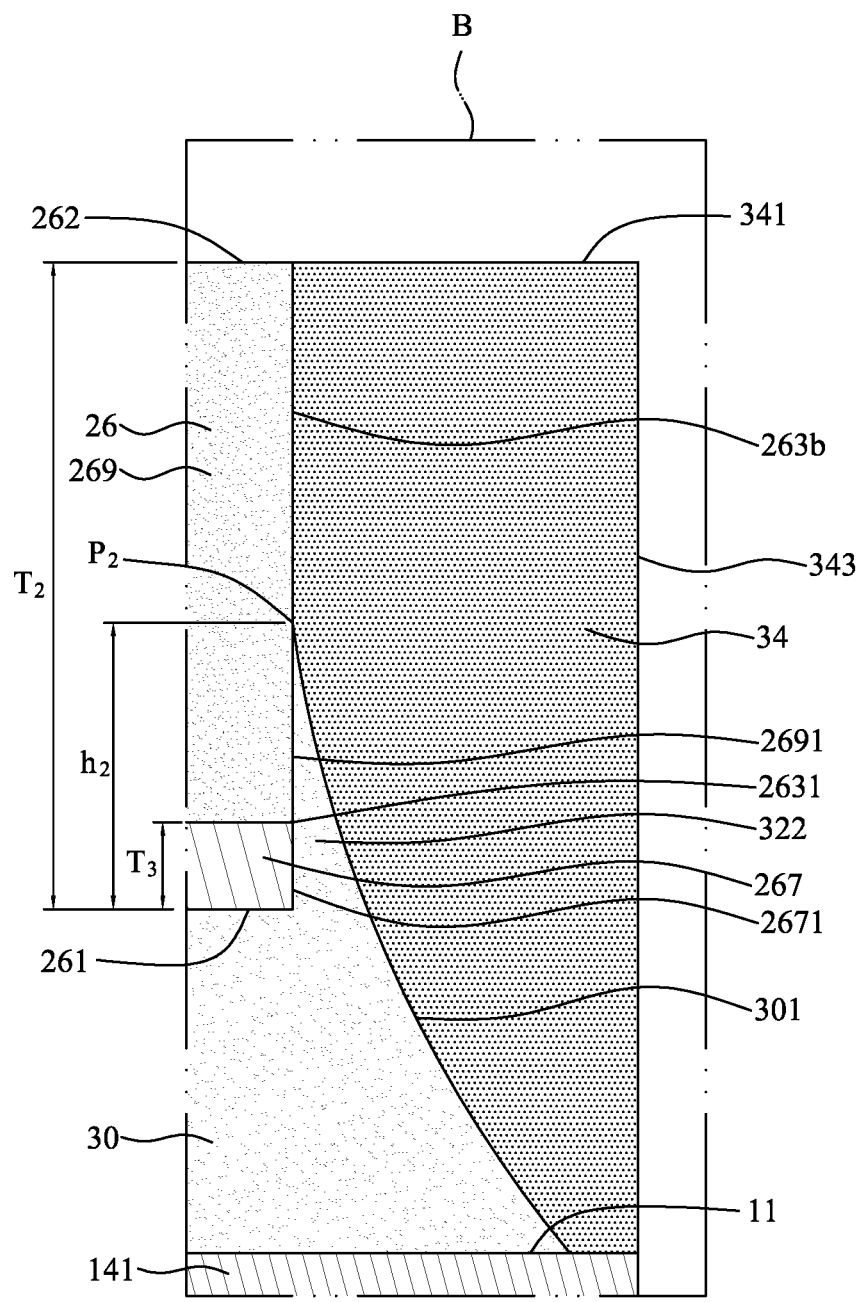
FIG. 5 illustrates an enlarged view of a region "B" in FIG. 2.

FIG. 5 illustrates an enlarged view of a region "B" in FIG. 2. A thickness of the second electronic device 26 is $T_2$. The second portion 322 of the first protection material 32 extends on the second lateral side surface 263b of the second electronic device 26 and covers at least a portion of the second lateral side surface 263b of the second electronic device 26. In some embodiments, the second lateral side surface 263b of the second electronic device 26 includes a first interface 2631 between two different materials (including, for example, the logic die 267 and the second encapsulant 269), and the second portion 322 of the first protection material 32 covers the interface 2631. That is, the second portion 322 of the first protection material 32 extends beyond the interface 2631. In some embodiments, there may be a second interface 301 formed between the second protection material 34 (e.g., the first encapsulant and the first protection material 32. The second interface 301 does not contact the first interface 2631. As shown in FIG. 5, a highest point of the second portion 322 of the protection material 32 on the second lateral side surface 263b of the second electronic device 26 is $P_2$. A second height (e.g., a maximum height) of the second portion 322 of the protection material 32 on the second lateral side surface 263b of the second electronic device 26 is $h_2$. The second height $h_2$ is measured from the second active surface 261 toward the second backside surface 262, and is the vertical distance between the second active surface 261 and the highest point $P_2$. In some embodiments, the second height $h_2$ is greater than or equal to 0.3 times the thickness $T_2$, greater than or equal to 0.4 times the thickness $T_2$, greater than or equal to 0.5 times the thickness $T_2$, or greater than or equal to 0.6 times the thickness $T_2$. In some embodiments, the second height $h_2$ is greater than a thickness $T_3$ of the logic die 267. Thus, the second portion 322 of the first protection material 32 may cover the entire lateral side surface 2671 of the logic die 267. Further, the second portion 322 of the protection material 32 may cover a portion of a lateral side surface 2691 of the second encapsulant 269. That is, the highest point $P_2$ may be disposed on the lateral side surface 2691 of the second encapsulant 269. Alternatively, the second portion 322 of the first protection material 32 may cover the entire second lateral side surface 263b of the second electronic device 26. The large second height $h_2$ of the second portion 322 of the first protection material 32 may reduce the delamination between the first protection material 32 and the second protection material 34.

Figure 6:
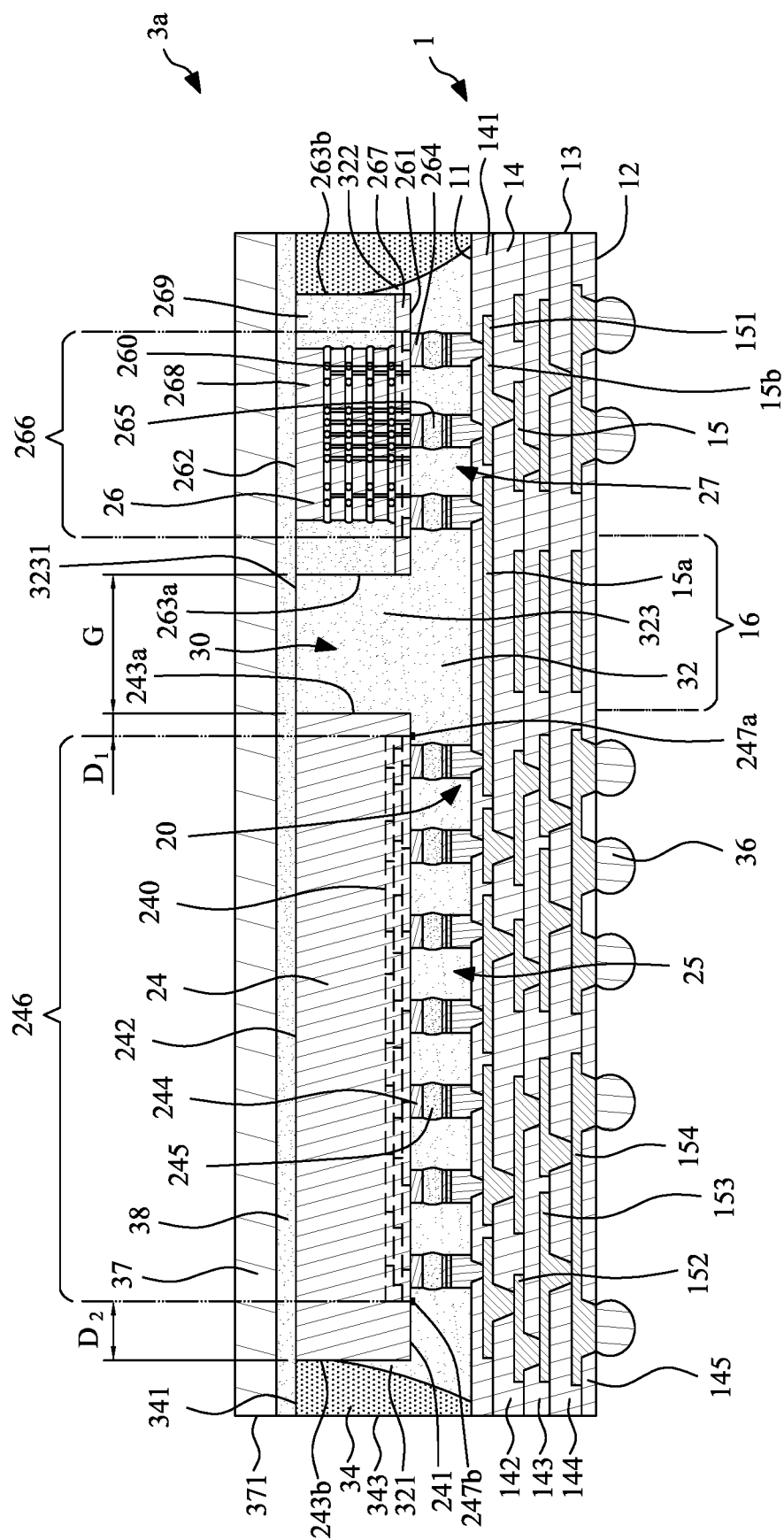
FIG. 6 illustrates a cross-sectional view of an example of a package structure according to some embodiments of the present disclosure.

FIG. 6 illustrates a cross-sectional view of an example of a package structure 3a according to some embodiments of the present disclosure. The package structure 3a of FIG. 6 is similar to the package structure 3 of FIG. 1 to FIG. 3, except that the package structure 3a further includes a reinforcement structure 37. As shown in FIG. 6, the reinforcement structure 37 may be attached to the top surface 3231 of the third portion 323 of the protection material 32, the first backside surface 242 of the first electronic device 24 and the second backside surface 262 of the second electronic device 26 through an adhesion layer 38. The reinforcement structure 37 may have a lateral side surface 371 substantially coplanar with the lateral side surface 343 of the second protection material 34. A material of the reinforcement structure 37 may be silicon so as to increase the rigidity or stiffness of the semiconductor package structure 3a and reduce the warpage of the semiconductor package structure 3a. In some embodiments, the reinforcement structure 37 may be a semiconductor die.

Figure 7:
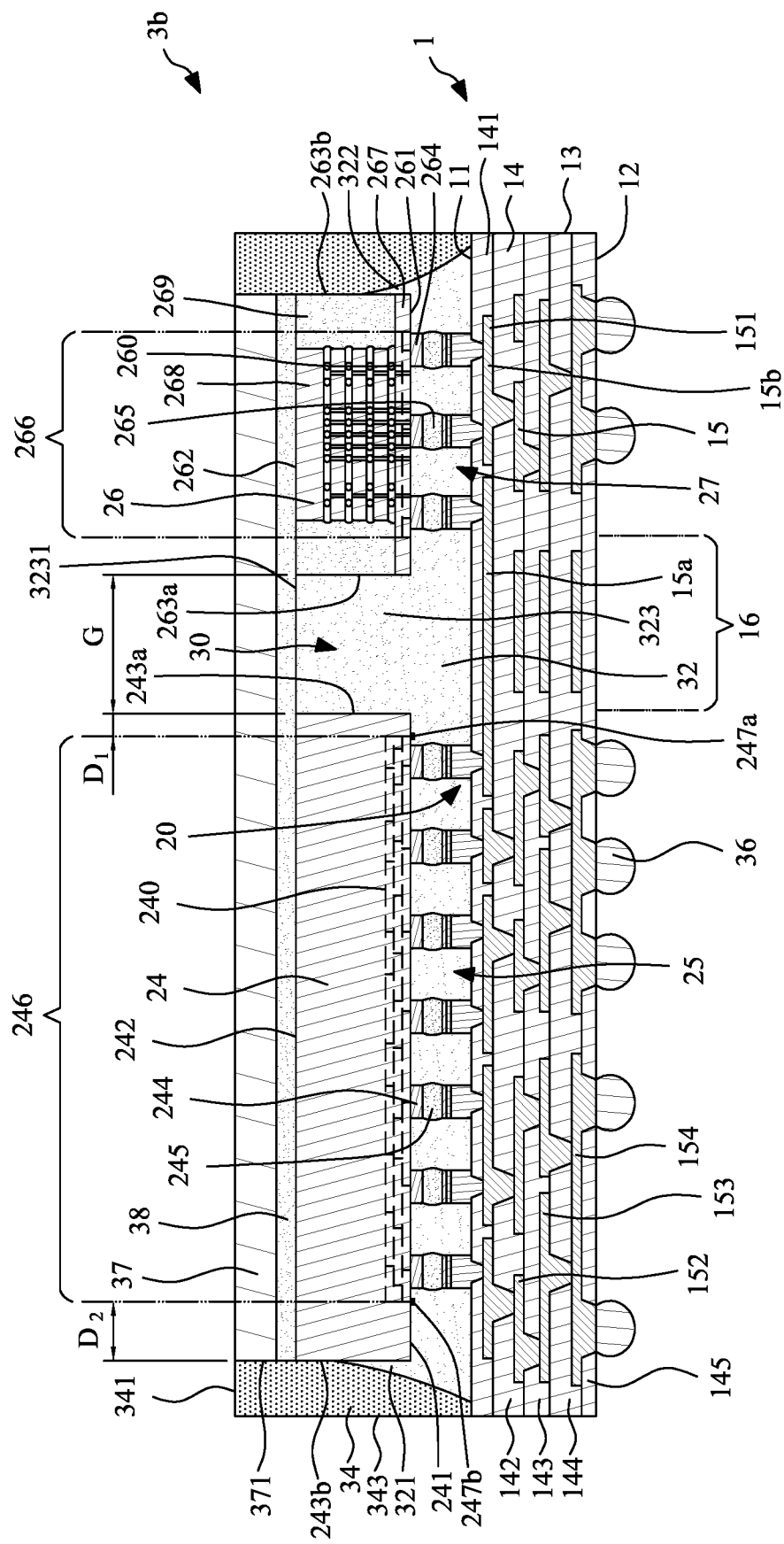
FIG. 7 illustrates a cross-sectional view of an example of a package structure according to some embodiments of the present disclosure.

FIG. 7 illustrates a cross-sectional view of an example of a package structure 3b according to some embodiments of the present disclosure. The package structure 3b of FIG. 7 is similar to the package structure 3a of FIG. 6, except for a structure of the reinforcement structure 37. As shown in FIG. 7, the lateral side surface 371 of the reinforcement structure 37 may have a substantially coplanar with the second lateral side surface 243b, the third lateral side surface 243c and the fourth lateral side surface 243d of the first electronic device 24, the second lateral side surface 263b of the second electronic device 26, and the second lateral side surface 263b' of the second electronic device 26'.

Figure 8:
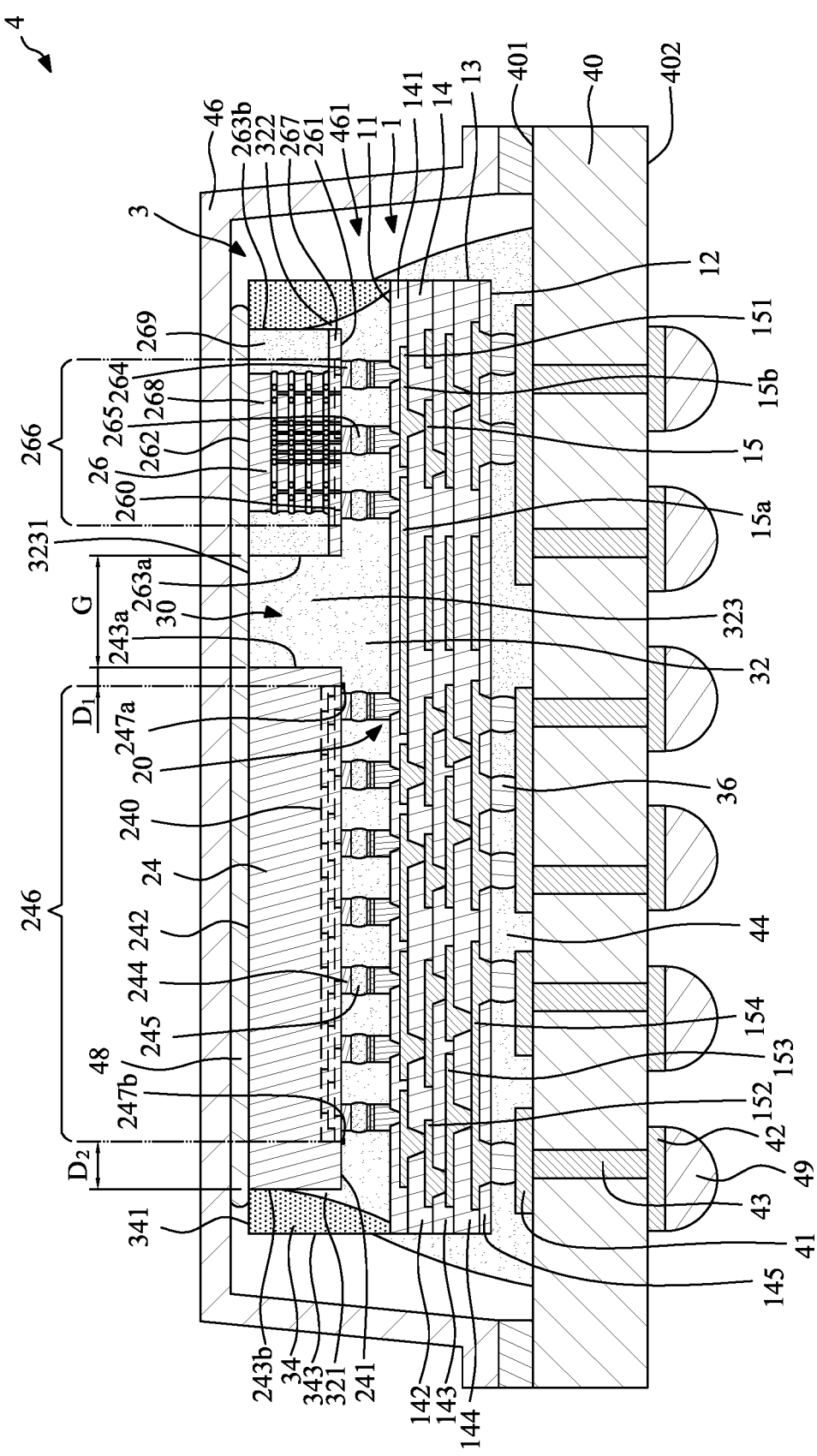
FIG. 8 illustrates a cross-sectional view of an assembly structure according to some embodiments of the present disclosure.

FIG. 8 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 8, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 8 may be same as or similar to the package structure 3 of FIG. 1 to FIG. 3. The package structure 3 may be electrically connected to the first circuit layer 41 of the base substrate 40 through the solder materials 36. A third protection material (i.e., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection. It is noted that the package structure 3 may be replaced by the package structures 3a, 3b of FIGS. 6, 7.

FIG. 9 through FIG. 20 illustrate a method for manufacturing an assembly structure according to some embodiments of the present disclosure. In some embodiments, the method is for manufacturing the package structure 3 shown in FIG. 1 to FIG. 3, and the assembly structure 4 of FIG. 8.

Figure 9:
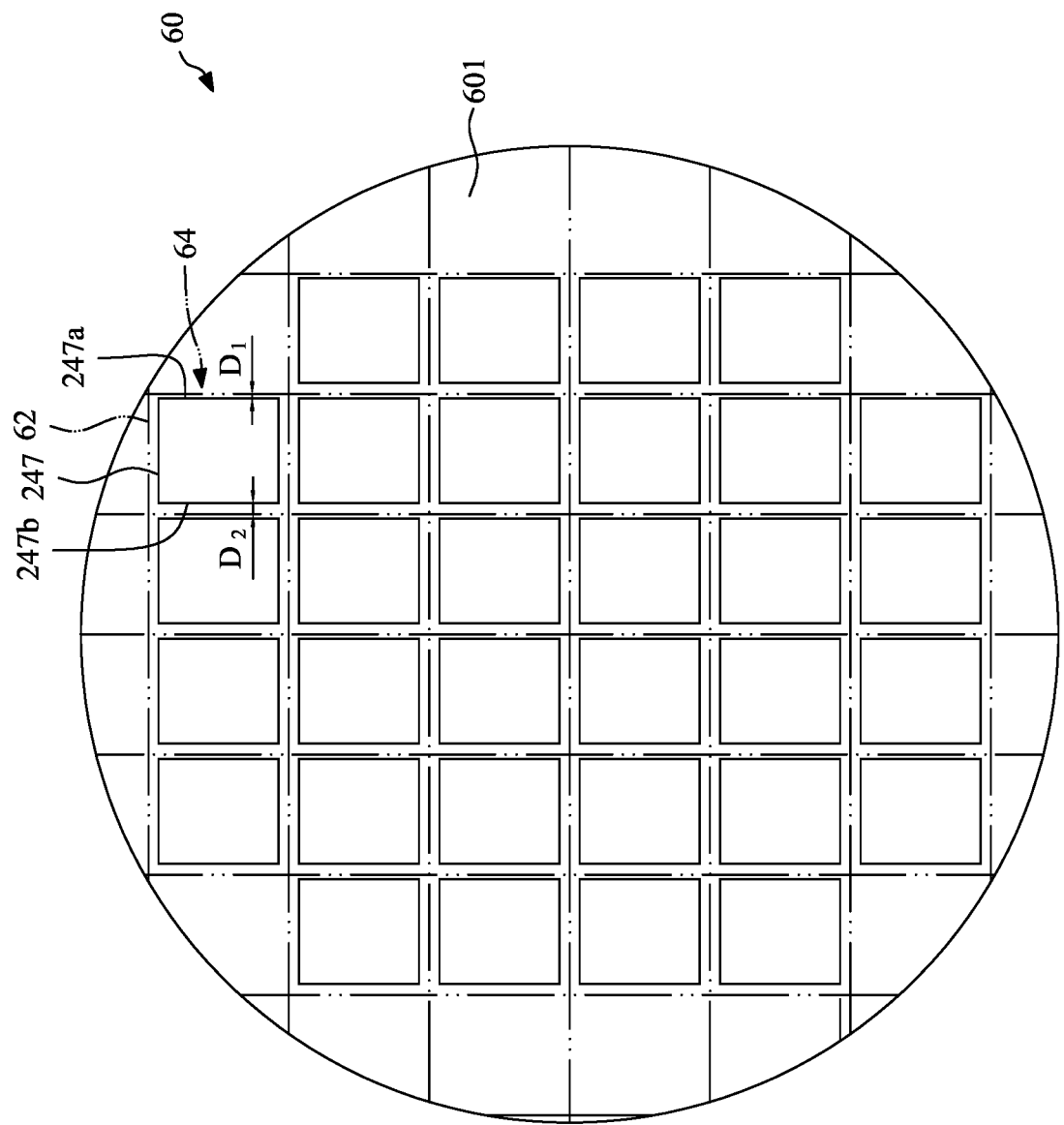
FIG. 9 illustrates one or more stages of an example of a method for manufacturing an assembly structure according to some embodiments of the present disclosure.
Figure 10:
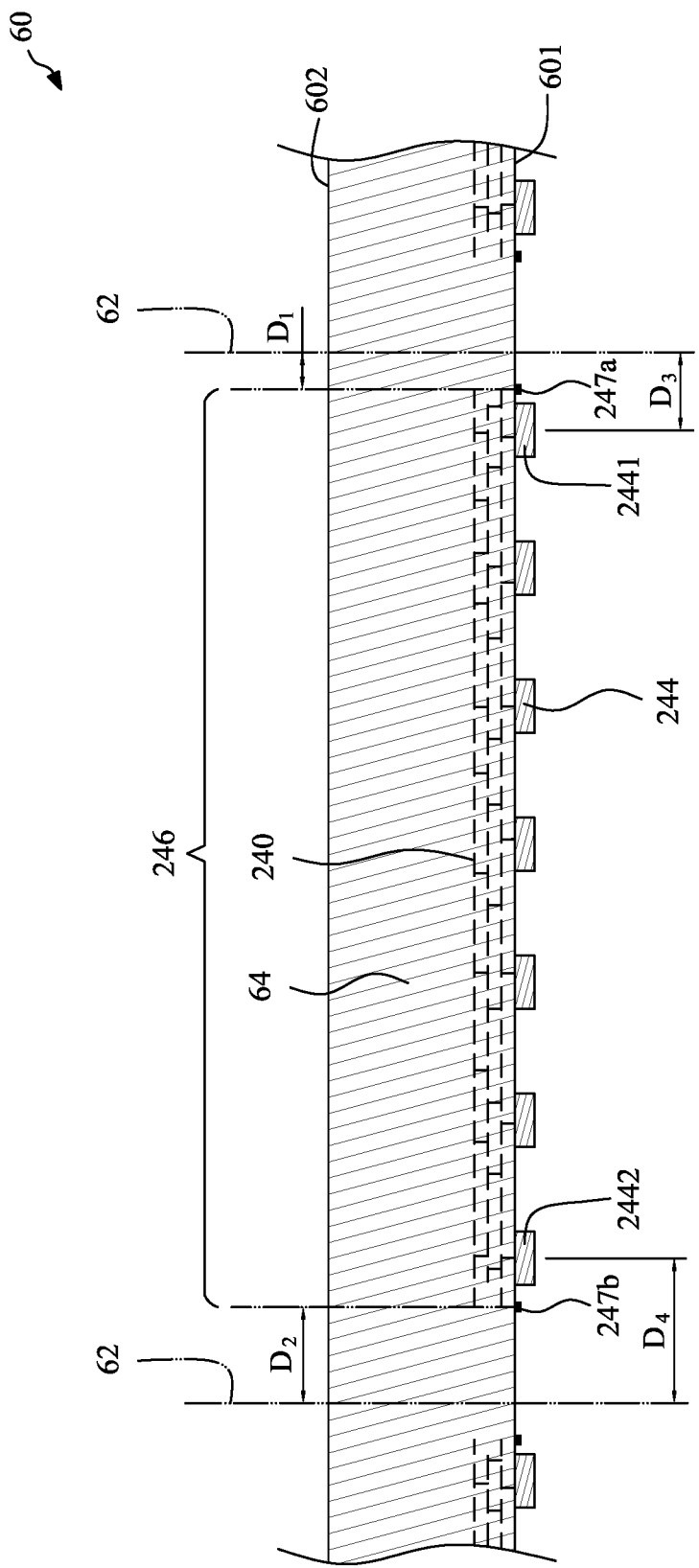
FIG. 10 illustrates one or more stages of an example of a method for manufacturing an assembly structure according to some embodiments of the present disclosure.

Referring to FIG. 9 and FIG. 10, a wafer 60 is provided, wherein FIG. 9 illustrates a top view of the wafer 60 according to some embodiments of the present disclosure, and FIG. 10 illustrates a partially enlarged cross-sectional view of the wafer 60 of FIG. 9. The wafer 60 may be circular, rectangular, square or elliptical. In some embodiments, the wafer 60 may be a silicon wafer. As shown in FIG. 9 and FIG. 10, the wafer 60 has a plurality of imaginary cutting lines 62 crossed with each other to define a plurality of die units 64. In some embodiments, the wafer 60 may have a first surface 601 (e.g., an active surface) and a second surface 602 (e.g., a backside surface) opposite to the first surface 601. In addition, the wafer 60 may include a main body, a plurality of first active areas 246, a plurality of seal rings 247 and a plurality of electrical contacts 244. The main body may include a silicon material. Each of the first active areas 246 may be disposed on the main body, and may include a plurality of active circuit layers 240 and a plurality of electrical elements electrically connected with each other. There may be no active circuit layers and electrical elements disposed outside the first active areas 246. The electrical contacts 244 are disposed adjacent to the first surface 601, and electrically connected to the active circuit layers 240 in the first active areas 246. The electrical contacts 244 may be exposed or may protrude from the first surface 601 for electrical connection. The electrical contacts 244 may be pads, bumps, studs, pillars or posts.

In some embodiments, the seal rings 247 may be disposed on the main body of the wafer 60 and may be disposed adjacent to the first surface 601. For example, each of the seal rings 247 may define the first active area 246. That is, the first active area 246 may be the area that is surrounded by the seal ring 247. The seal ring 247 may have a first edge 247a and a second edge 247b opposite to the first edge 247a. In addition, a first distance $D_1$ between the imaginary cutting line 62 and the first edge 247a of the seal ring 247 is less than a second distance $D_2$ between the imaginary cutting line 62 and the second edge 247b of the seal ring 247. It is noted that the first distance $D_1$ may be a distance between the imaginary cutting line 62 and the first active area 246, and the second distance $D_2$ may be a distance between the imaginary cutting line 62 and the first active area 246.

Then, the wafer 60 may be cut by a cutting tool, such as a first cutting blade 66, along the imaginary cutting lines 62. Meanwhile, the die units 64 become a plurality of first electronic devices 24 shown in FIG. 2 and FIG. 3. Thus, at least one first electronic device 24 is provided.

The first electronic device 24 has a first active surface 241, a first backside surface 242, a first lateral side surface 243a, a second lateral side surface 243b, a third lateral side surface 243c and a fourth lateral side surface 243d. Further, the first electronic device 24 may include a main body, a first active area 246, a plurality of electrical contacts 244 and a seal ring 247. The first active area 246 may be disposed on the main body and may be disposed adjacent to the first active surface 241. In some embodiments, the seal ring 247 may be disposed on the main body and may be disposed adjacent to the first active surface 241. For example, the seal ring 247 may define the first active area 246. The seal ring 247 may have a first edge 247a and a second edge 247b opposite to the first edge 247a. The electrical contacts 244 may be disposed adjacent to the first active surface 241 and within the first active area 246.

As shown in FIG. 1, the first electronic device 24 has a first center $O_1$ from a top view. The first active area 246 has a second center $O_2$ from a top view. The second center $O_2$ of the first active area 246 is misaligned with the first center $O_1$ of the first electronic device 24. In addition, the first distance $D_1$ between the first lateral side surface 243a and the first active area 246 is less than the second distance $D_2$ between the second lateral side surface 243b and the first active area 246.

Figure 11:
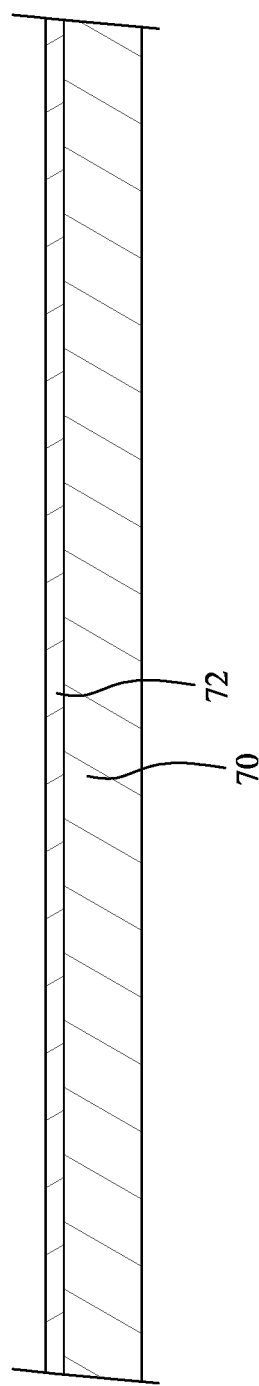
FIG. 11 illustrates one or more stages of an example of a method for manufacturing an assembly structure according to some embodiments of the present disclosure.

Referring to FIG. 11, a carrier 70 is provided. The carrier 70 may include a release layer 72 disposed thereon.

Figure 12:
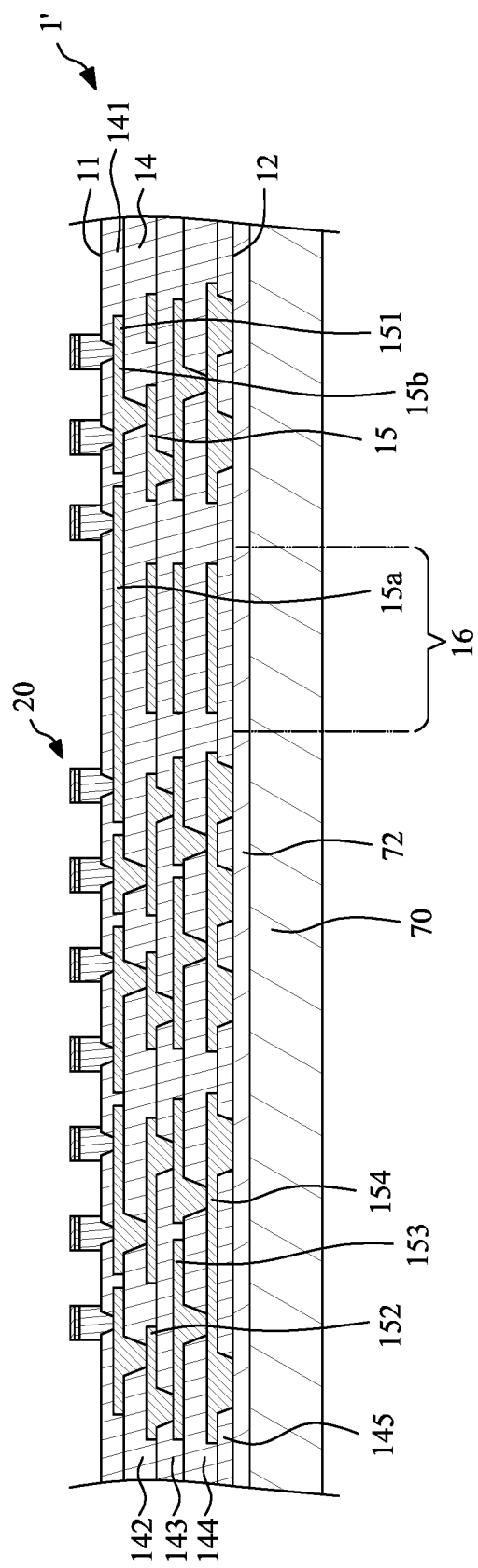
FIG. 12 illustrates one or more stages of an example of a method for manufacturing an assembly structure according to some embodiments of the present disclosure.

Referring to FIG. 12, a wiring structure 1' is formed or disposed on the release layer 72 on the carrier 70. The wiring structure 1' of FIG. 11 may be similar to the wiring structure 1 of FIG. 2 and FIG. 3, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 20. For example, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145.

Figure 13:
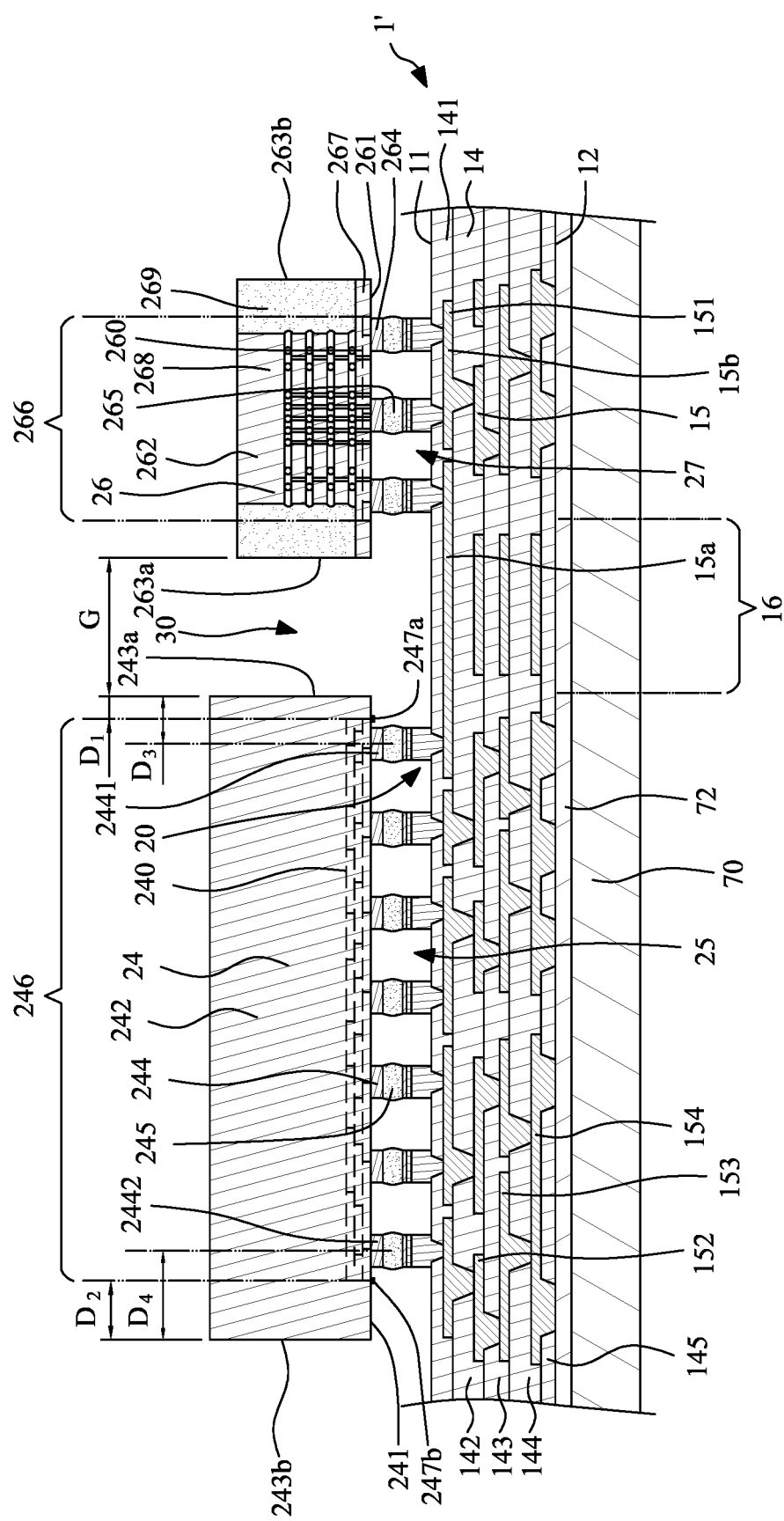
FIG. 13 illustrates one or more stages of an example of a method for manufacturing an assembly structure according to some embodiments of the present disclosure.

Referring to FIG. 13, a second electronic device 26 is provided. The second electronic device 26 of FIG. 13 may be similar to the second electronic device 26 of FIG. 2 and FIG. 3. Then, the first electronic device 24 and the second electronic device 26 are electrically connected to the circuit layer 15 of the wiring structure 1' by flip-chip bonding. Thus, the first electronic device 24 and the second electronic device 26 are disposed on the wiring structure 1' side by side, and the second electronic device 26 may be electrically connected to the first electronic device 24 through the interconnection portion 15a of the circuit layer 15. Meanwhile, a gap 30 is formed between the first electronic device 24 and the second electronic device 26. The gap 30 may be defined by the first lateral side surface 243a of the first electronic device 24 and the first lateral side surface 263a of the second electronic device 26. A width G of the gap 30 may be greater than or equal to about 150 greater than or equal to about 200 or greater than or equal to about 300 For example, the width G of the gap 30 may be in a range of 200 μm to 400 μm. As shown in FIG. 1, the second center $O_2$ of the first active area 246 is located between the first center $O_1$ of the first electronic device 24 and the gap 30.

Figure 14:
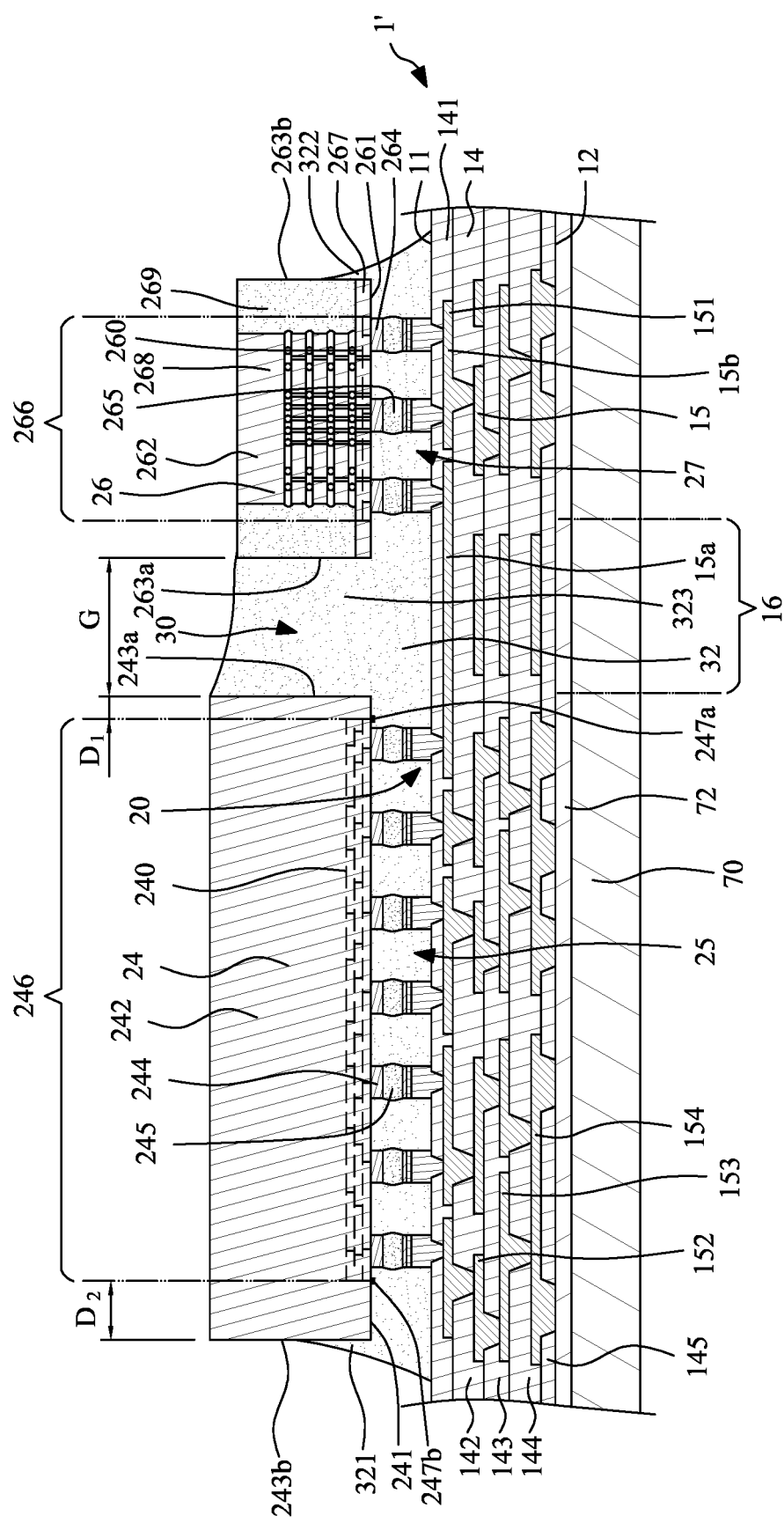
FIG. 14 illustrates one or more stages of an example of a method for manufacturing an assembly structure according to some embodiments of the present disclosure.

Referring to FIG. 14, a first protection material 32 (i.e., an underfill) is formed or disposed in a first space 25 between the first electronic device 24 and the wiring structure 1', and in a second space 27 between the second electronic device 26 and the wiring structure 1' so as to cover and protect the joints formed by the electrical contacts 244, the protrusion pads 20 and the solder materials 245, and the joints formed by the electrical contacts 264, the protrusion pads 20 and the solder materials 265. In addition, the first protection material 32 may include a first portion 321, a second portion 322 and a third portion 323. The third portion 323 of the first protection material 32 may further extend into the gap 30 to substantially fill the gap 30. The first portion 321 of the first protection material 32 may extend to or may be disposed on the second lateral side surface 243b of the first electronic device 24. The second portion 322 of the first protection material 32 may extend to or may be disposed on the second lateral side surface 263b of the second electronic device 26. As shown in FIG. 14, the first protection material 32 may reach to the level of the second surface 242 of the first electronic device 24 and the second surface 262 of the second electronic device 26 even the gap 30 is enlarged. In some embodiments, the first protection material 32 may be formed by the following two methods.

Figure 15:
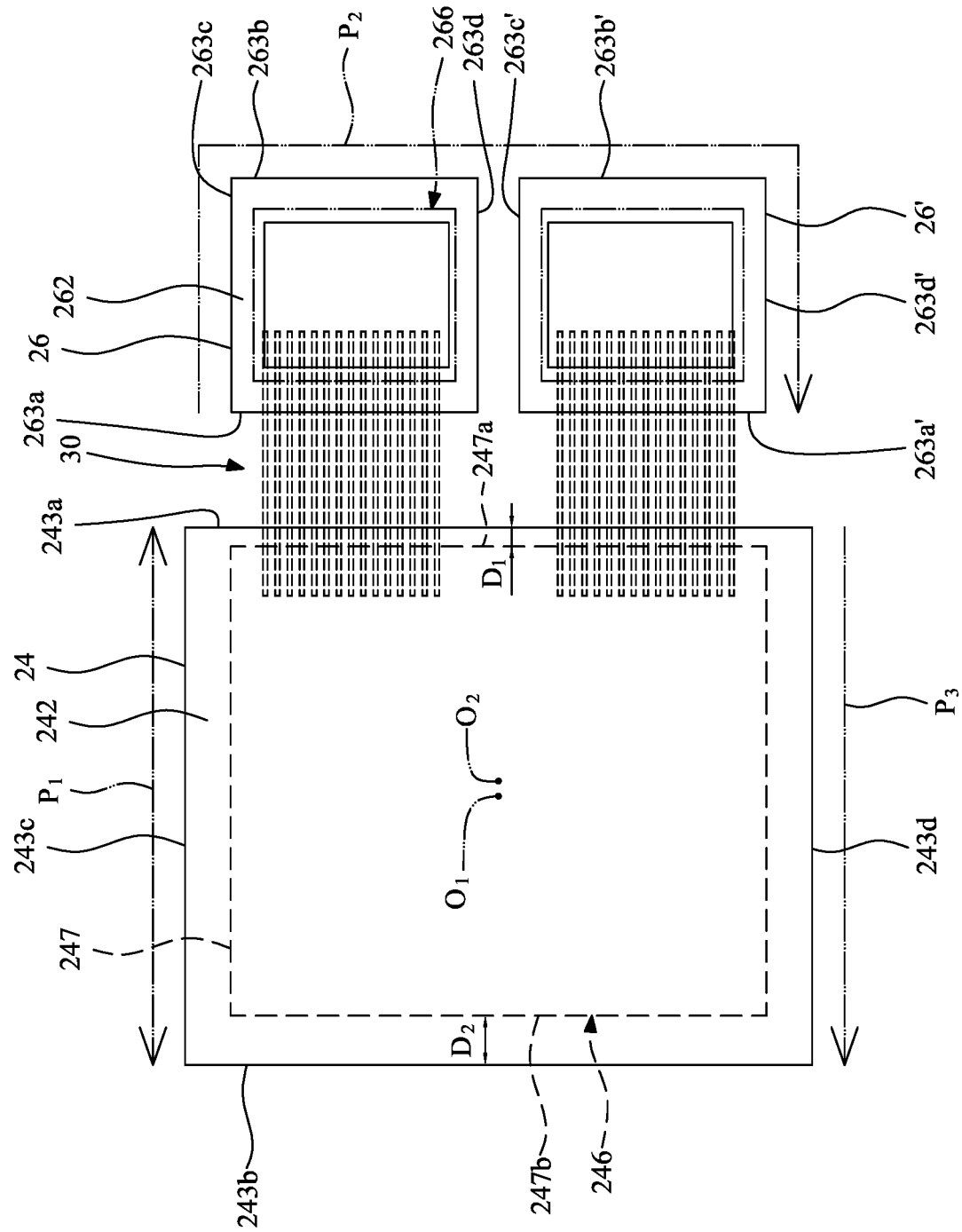
FIG. 15 illustrates one or more stages of an example of a method for manufacturing an assembly structure according to some embodiments of the present disclosure.

Referring to FIG. 15, a first method for applying the first protection material 32 is illustrated. As shown in FIG. 15, from a top view, the first protection material 32 is applied along a peripheral side edge of a combination of the first electronic device 24 and the second electronic device 26. For example, the first protection material 32 may be applied along the third lateral side surface 243c of the first electronic device 24 back and forth, as shown in a first path $P_1$ of FIG. 15. Then, the first protection material 32 may be applied along the third lateral side surface 263c of the second electronic device 26, the second lateral side surface 263b of the second electronic device 26, the second lateral side surface 263b' of the second electronic device 26' and the fourth lateral side surface 263d' of the second electronic device 26', as shown in a second path $P_2$ of FIG. 15. That is, the first protection material 32 is applied along a peripheral side edge of a combination of the first electronic device 24 and the second electronic device 26. Alternatively, the first protection material 32 is applied along a direction from the third lateral side surface 243c of the first electronic device 24 toward another lateral side surface (i.e., the fourth lateral side surface 243d opposite to the third lateral side surface 243c) of the first electronic device 24. Then, the first protection material 32 may be applied along another lateral side surface (i.e., the fourth lateral side surface 243d opposite to the third lateral side surface 243c) of the first electronic device 24, as shown in a third path $P_3$ of FIG. 15. In addition, the third path $P_3$ is a direction from the second electronic device 26' toward the first electronic device 24.

Figure 16:
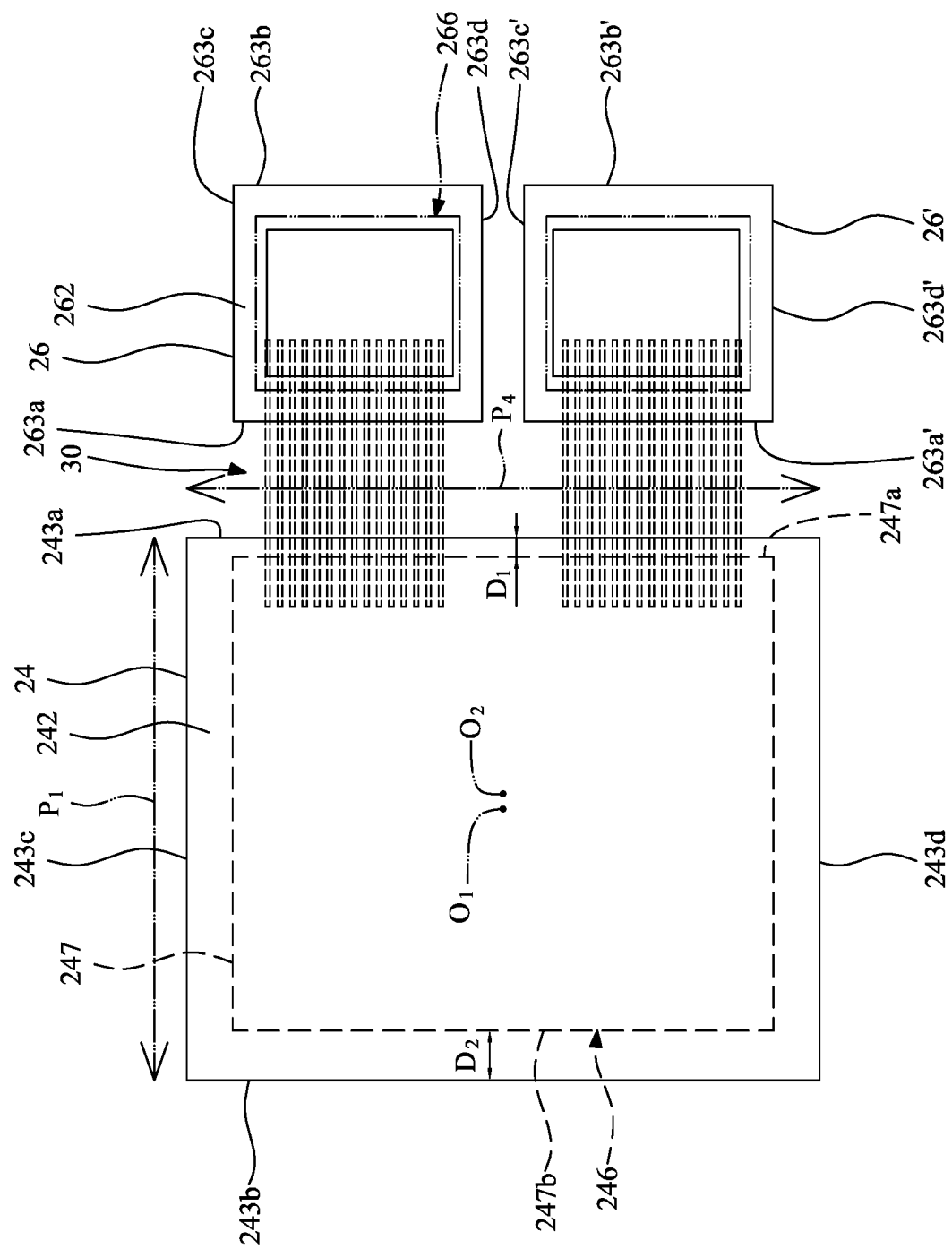
FIG. 16 illustrates one or more stages of an example of a method for manufacturing an assembly structure according to some embodiments of the present disclosure.

Referring to FIG. 16, a second method for applying the first protection material 32 is illustrated. As shown in FIG. 16, from a top view, the first protection material 32 may be applied along the third lateral side surface 243c of the first electronic device 24 back and forth, as shown in a first path $P_1$ of FIG. 16. Then, the first protection material 32 may be applied along another lateral side surface (i.e., the first lateral side surface 243a) facing the second electronic device 26 back and forth. That is, the first protection material 32 may be applied along the gap 30 between the first lateral side surface 243a of the first electronic device 24 and the first lateral side surface 263a of the second electronic device 26, and between the first lateral side surface 243a of the first electronic device 24 and the first lateral side surface 263a' of the second electronic device 26' back and forth, as shown in a fourth path $P_4$ of FIG. 16.

Figure 17:
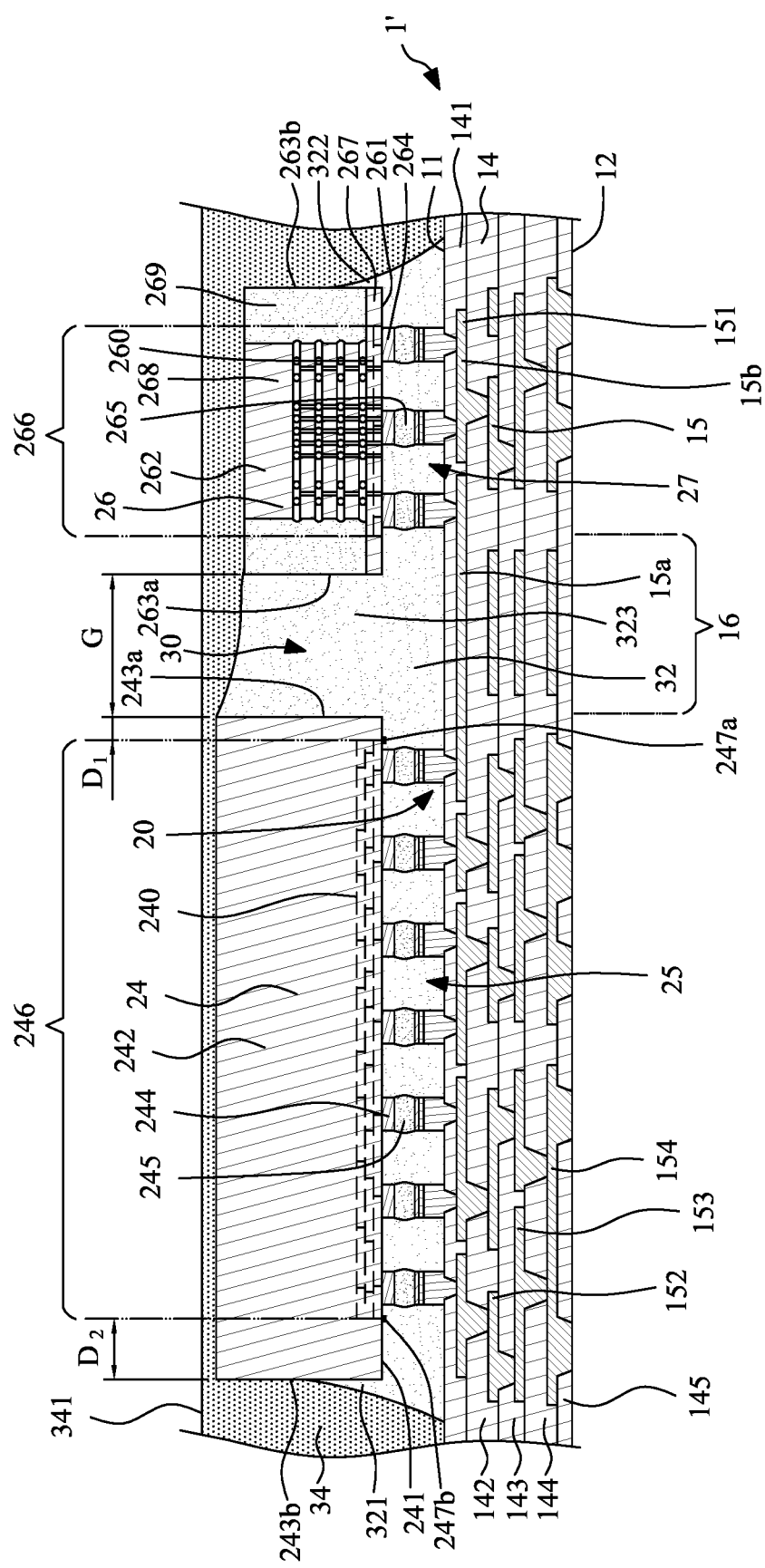
FIG. 17 illustrates one or more stages of an example of a method for manufacturing an assembly structure according to some embodiments of the present disclosure.

Referring to FIG. 17, a second protection material 34 (e.g., a first encapsulant) is formed or disposed to cover at least a portion of the first surface 11 of the wiring structure 1', at least a portion of the first electronic device 24, at least a portion of the second electronic device 26 and the first protection material 32. The second protection material 34 has a first surface 341 (e.g., a top surface). Then, the carrier 70 and the release layer 72 are removed. Thus, portions (i.e., the bottom portions of the via portions) of the fourth circuit layer 154 are exposed from the second surface 12 of the wiring structure 1'.

Figure 18:
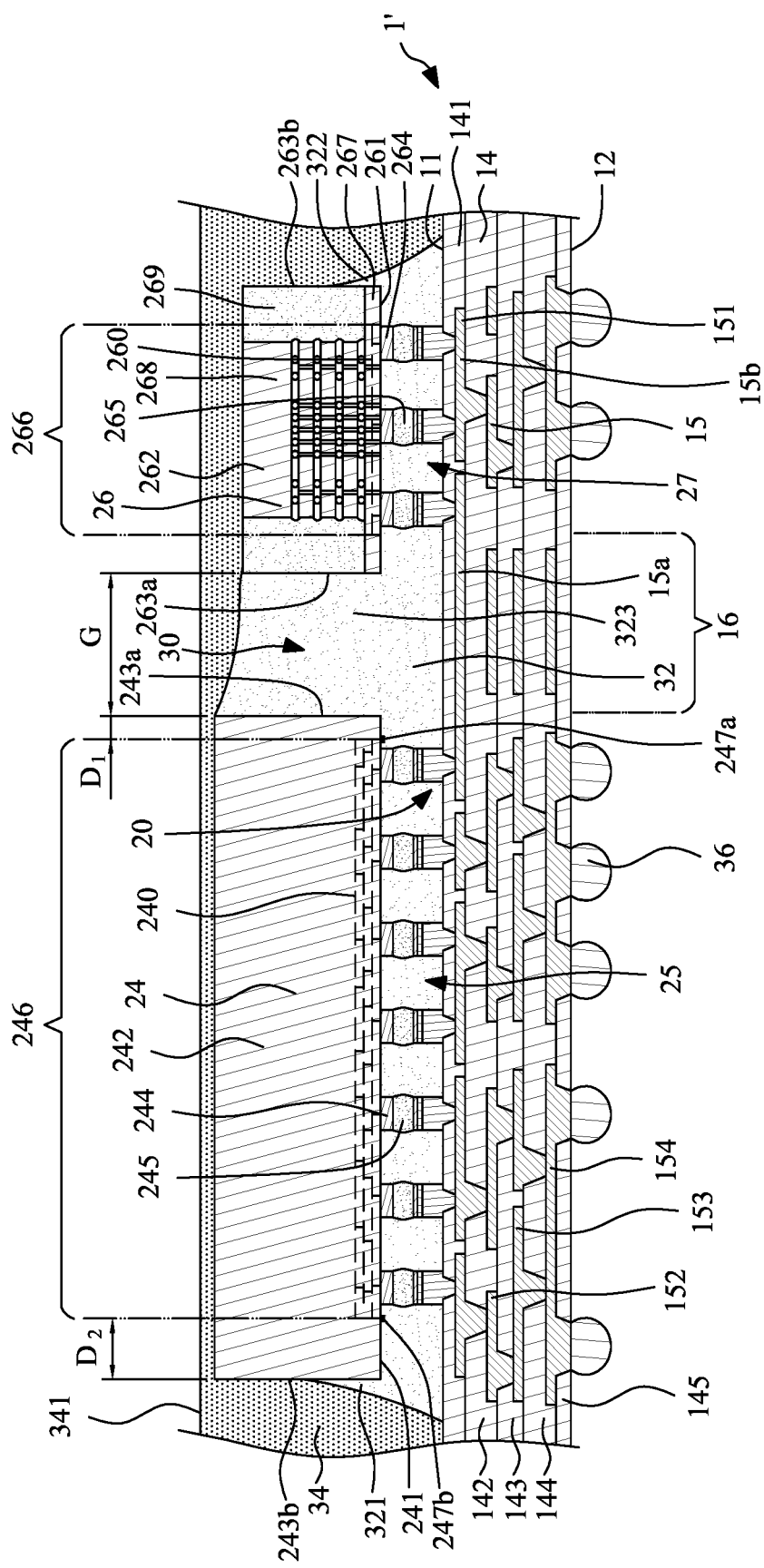
FIG. 18 illustrates one or more stages of an example of a method for manufacturing an assembly structure according to some embodiments of the present disclosure.

Referring to FIG. 18, a plurality of solder materials 36 (e.g., solder balls) are formed or disposed on the second surface 12 of the wiring structure 1'. For example, the solder materials 36 may be disposed on the exposed portions (i.e., the bottom portions of the via portions) of the fourth circuit layer 154.

Figure 19:
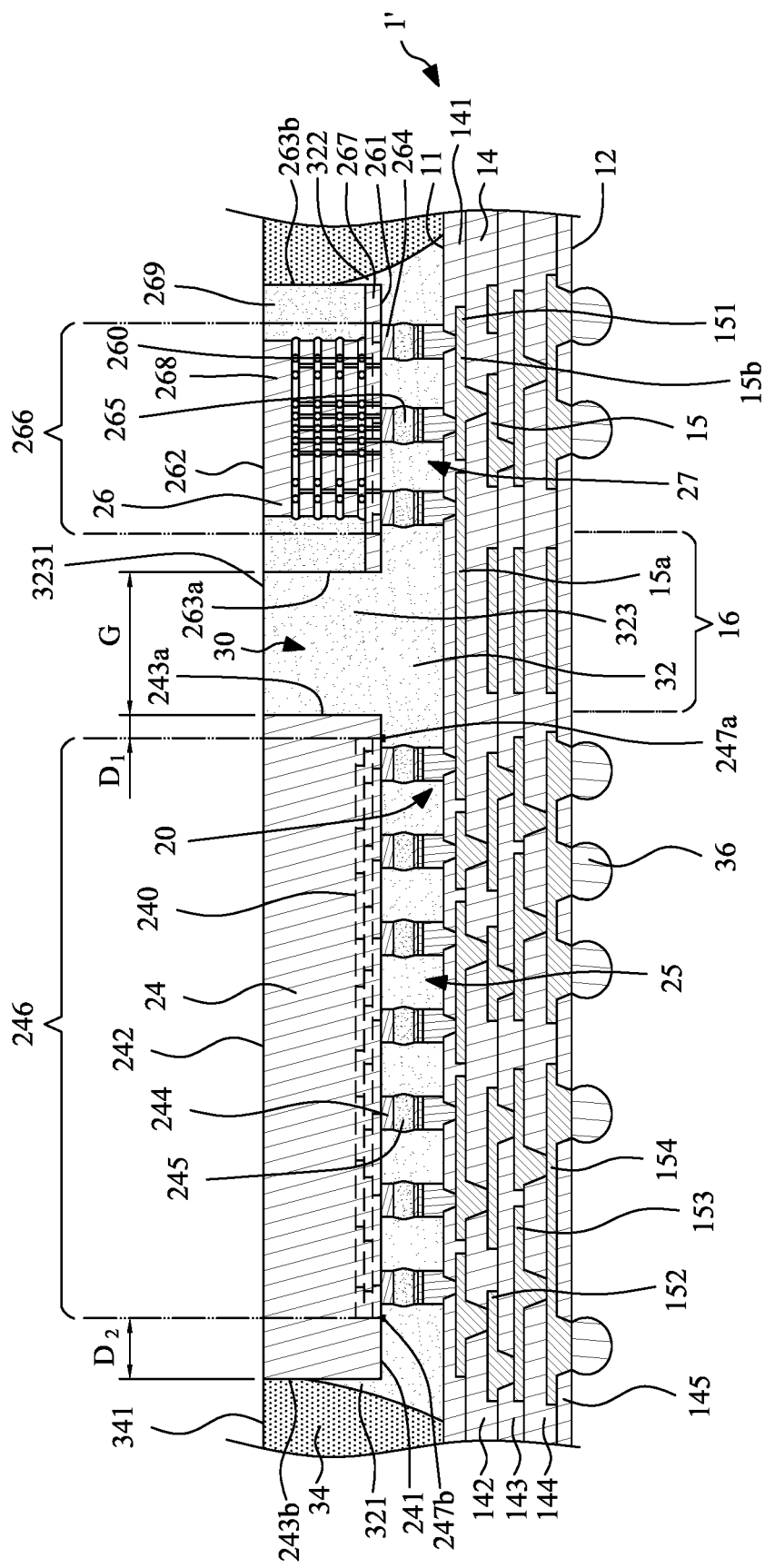
FIG. 19 illustrates one or more stages of an example of a method for manufacturing an assembly structure according to some embodiments of the present disclosure.

Referring to FIG. 19, the second protection material 34 is thinned from its first surface 341 by, for example, grinding. Thus, the first surface 341 of the second protection material 34, the second surface 242 of the first electronic device 24, the second surface 262 of the second electronic device 26 and the top surface 3231 of the third portion 323 of the first protection material 32 may be substantially coplanar with each other. Then, a singulation process may be conducted to the wiring structure 1' so as to obtain a plurality of package structures 3 shown in FIG. 1 to FIG. 3.

Figure 20:
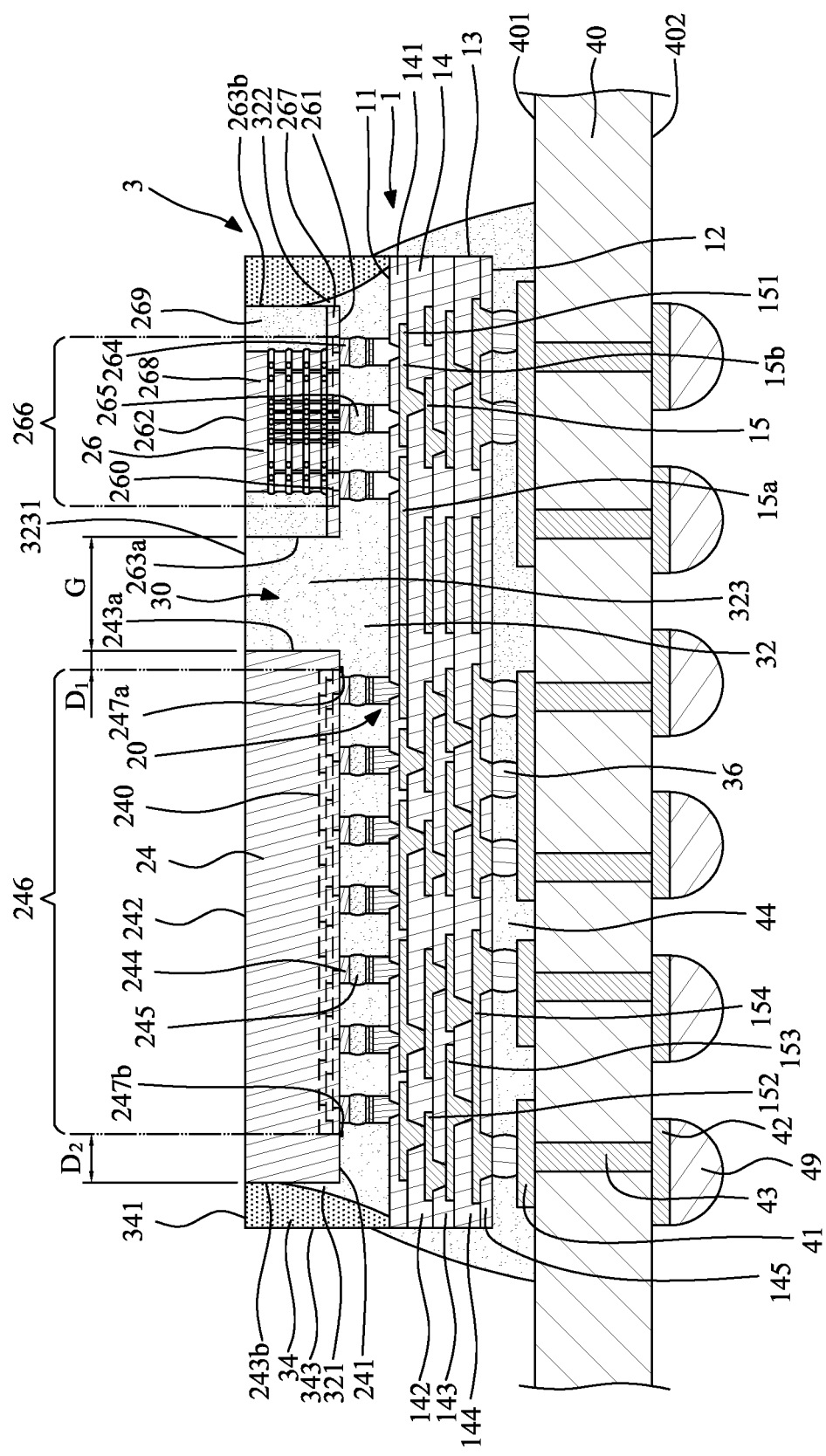
FIG. 20 illustrates one or more stages of an example of a method for manufacturing an assembly structure according to some embodiments of the present disclosure.

Referring to FIG. 20, the package structure 3 may be electrically connected to a first surface 401 of a base substrate 40 through the solder materials 36. Then, a third protection material 44 (i.e., an underfill) is formed or disposed in a space between the package structure 3 and the base substrate 40 so as to cover and protect the solder materials 36. Then, a heat sink 46 may be attached to package structure 3 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material.

Then, a singulation process may be conducted to the base substrate 40 so as to obtain a plurality of assembly structures 4 shown in FIG. 8.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a wiring structure;
   a first electronic device disposed on the wiring structure, and having a first lateral side surface and a second lateral side surface opposite to the first lateral side surface;
   a second electronic device disposed on the wiring structure, and having a first lateral side surface and a second lateral side surface opposite to the first lateral side surface, wherein the first electronic device and the second electronic device are disposed side by side, and a gap between the first electronic device and the second electronic device is greater than or equal to about 150 μm;
   a protection material substantially filling the gap; and
   a first encapsulant covering the protection material, at least a portion of the second lateral side surface of the first electronic device and at least a portion of the second lateral side surface of the second electronic device, wherein the first lateral side surface of the first electronic device faces to the gap and the first lateral side surface of the second lateral side surface faces to the gap.

2. The package structure of claim 1, wherein the second lateral side surface of the second electronic device includes a first interface between two different materials, wherein a second interface between the first encapsulant and the protection material does not contact the first interface.

3. The package structure of claim 2, wherein the protection material extends beyond the first interface.

4. The package structure of claim 1, wherein a thickness of the second electronic device is $T_2$, a second height of a second portion of the protection material on the second lateral side surface is $h_2$, and $h_2$ is greater than or equal to 0.3 times $T_2$.

5. The package structure of claim 1, wherein a thickness of the first electronic device is $T_1$, a first height of a first portion of the protection material on a lateral side surface of the first electronic device is $h_1$, and $h_1$ is greater than or equal to 0.5 times $T_1$.

6. The package structure of claim 1, further comprising a reinforcement structure attached to a top surface of the first electronic device, a top surface of the second electronic device and a top surface of the protection material.

7. The package structure of claim 1, wherein the gap is in a range of 200 μm to 400 μm.

8. The package structure of claim 1, wherein the protection material includes an underfill.

9. The package structure of claim 1, wherein the first electronic device has a first active surface, a first backside surface opposite to the first active surface, the first lateral side surface extending between the first active surface and the first backside surface, and a first active area disposed adjacent to the first active surface, wherein a first distance between the first lateral side surface of the first electronic device and the first active area is less than a second distance between the second lateral side surface of the first electronic device and the first active area.

10. The package structure of claim 9, wherein the first active area is defined by a seal ring disposed adjacent to the first active surface.

11. The package structure of claim 1, wherein the first electronic device has a first active surface and a first backside surface opposite to the first active surface, the second electronic device has a second active surface and a second backside surface opposite to the second active surface, and a third portion of the protection material in the gap has a top surface substantially coplanar with the first backside surface and the second backside surface.

12. The package structure of claim 1, wherein the first electronic device has a first center and a first active area, the first active area has a second center, wherein the second center of the first active area is located between the first center of the first electronic device and the gap.

13. The package structure of claim 1, wherein the second electronic device includes a logic die, a plurality of memory dice and a second encapsulant, the memory dice are stacked on the logic die, the second encapsulant covers the logic die and the memory dice, wherein the protection material covers an entire lateral side surface of the logic die.

14. The package structure of claim 2, wherein the second electronic device includes a logic die, a plurality of memory dice and a second encapsulant, the memory dice are stacked on the logic die, the second encapsulant covers the logic die and the memory dice, wherein the first interface is an interface between the logic die and the second encapsulant.

15. The package structure of claim 1, wherein the first electronic device includes a plurality of electrical contacts attached to the wiring structure, the electrical contacts include at least one first outermost electrical contact and at least one second outermost electrical contact, the first outermost electrical contact is the outermost electrical contact that is nearest to the second electronic device, the second outermost electrical contact is the outermost electrical contact that is farthest to the second electronic device, the second outermost electrical contact is opposite to the first outermost electrical contact, wherein a third distance between the first lateral side surface and the first outermost electrical contact is less than a fourth distance between the second lateral side surface and the second outermost electrical contact.

\* \* \* \* \*